US011891691B2

(12) United States Patent
Xu et al.

(10) Patent No.: US 11,891,691 B2
(45) Date of Patent: *Feb. 6, 2024

(54) METHOD OF FORMING A MULTILAYER SUBSTRATE COMPRISING A LAYER OF SILICON AND A LAYER OF DIAMOND HAVING AN OPTICALLY FINISHED (OR A DENSE) SILICON-DIAMOND INTERFACE

(71) Applicant: II-VI Delaware, Inc., Wilmington, DE (US)

(72) Inventors: Wen-Qing Xu, Sarver, PA (US); Chao Liu, Butler, PA (US); Giovanni Barbarossa, Saratoga, CA (US); Thomas E. Anderson, Morristown, NJ (US); Elgin E. Eissler, Renfrew, PA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/655,475

(22) Filed: Mar. 18, 2022

(65) Prior Publication Data

US 2022/0205084 A1   Jun. 30, 2022

Related U.S. Application Data

(60) Continuation of application No. 16/750,753, filed on Jan. 23, 2020, now Pat. No. 11,313,037, which is a
(Continued)

(51) Int. Cl.
C23C 16/27 (2006.01)
C23C 16/01 (2006.01)
(Continued)

(52) U.S. Cl.
CPC .............. *C23C 16/27* (2013.01); *C23C 16/01* (2013.01); *C23C 16/0254* (2013.01); *C23C 16/274* (2013.01); *C23C 16/56* (2013.01)

(58) Field of Classification Search
CPC ..... C23C 16/01; C23C 16/0254; C23C 16/27; C23C 16/274; C23C 16/56
See application file for complete search history.

(56) References Cited

U.S. PATENT DOCUMENTS 4,863,529 A   9/1989 Imai et al.
4,981,818 A   1/1991 Anthony et al.
(Continued)

FOREIGN PATENT DOCUMENTS

JP   0920592   1/1997
JP   1081589   3/1998
(Continued)

OTHER PUBLICATIONS

"Lattice constant", Accessed Mar. 3, 2017, Retrieved from https://en.wikipedia.org/wiki/Lattice_constant.
(Continued)

Primary Examiner — Lawrence D Ferguson
(74) Attorney, Agent, or Firm — Blank Rome LLP

(57) ABSTRACT

A method of making a multilayer substrate, which can include a silicon layer having an optically finished surface and a chemical vapor deposition (CVD) grown diamond layer on the optically finished surface of the silicon layer. At the interface of the silicon layer and the diamond layer, the optically finished surface of the silicon layer can have a surface roughness (Ra)≤100 nm. A surface of the grown diamond layer opposite the silicon layer can be polished to an optical finish and a light management coating can be applied to the polished surface of the grown diamond layer
(Continued)

opposite the silicon layer. A method of forming the multi-layer substrate is also disclosed.

19 Claims, 11 Drawing Sheets

Related U.S. Application Data division of application No. 15/450,110, filed on Mar. 6, 2017, now Pat. No. 10,584,412.

(60) Provisional application No. 62/305,197, filed on Mar. 8, 2016.

(51) Int. Cl.
*C23C 16/02* (2006.01)
*C23C 16/56* (2006.01)

(56) References Cited

U.S. PATENT DOCUMENTS

| | | | |
|---|---|---|---|
| 5,006,203 A | 4/1991 | Purdes | |
| 5,023,109 A | 6/1991 | Chin et al. | |
| 5,034,784 A | 7/1991 | Yamazaki | |
| 5,114,696 A | 5/1992 | Purdes | |
| 5,173,761 A | 12/1992 | Dreifus et al. | |
| 5,176,785 A | 1/1993 | Poyet et al. | |
| 5,236,545 A | 8/1993 | Pryor | |
| 5,242,711 A | 9/1993 | Denatale et al. | |
| 5,304,461 A | 4/1994 | Inoue et al. | |
| 5,350,944 A | 9/1994 | Geis et al. | |
| 5,368,681 A | 11/1994 | Hiraoka et al. | |
| 5,371,382 A | 12/1994 | Venkatesan et al. | |
| 5,397,428 A | 3/1995 | Stoner et al. | |
| 5,471,947 A | 12/1995 | Southworth et al. | |
| 5,561,303 A | 10/1996 | Schrantz et al. | |
| 5,650,639 A | 7/1997 | Schrantz et al. | |
| 5,696,665 A | 12/1997 | Nagy | |
| 5,800,879 A | 9/1998 | Moran et al. | |
| 5,935,323 A | 8/1999 | Tanga et al. | |
| 5,961,719 A | 10/1999 | Buhaenko et al. | |
| 6,063,187 A | 5/2000 | Lee et al. | |
| 6,508,911 B1 | 1/2003 | Han et al. | |
| 6,509,124 B1 | 1/2003 | Noguchi et al. | |
| 6,534,125 B1 | 3/2003 | Marchywka | |
| 6,758,264 B2 | 7/2004 | Azuma | |
| 6,964,880 B2 | 11/2005 | Ravi | |
| 7,033,912 B2 | 4/2006 | Saxler | |
| 7,244,963 B2 | 7/2007 | Ravi | |
| 7,285,479 B2 | 10/2007 | Tachibana et al. | |
| 7,367,875 B2 | 5/2008 | Slutz et al. | |
| 7,396,408 B2 | 7/2008 | Schreck et al. | |
| 7,695,564 B1 | 4/2010 | Micovic et al. | |
| 7,713,839 B2 | 5/2010 | Hu et al. | |
| 7,842,134 B2 | 11/2010 | Whitehead et al. | |
| 7,951,274 B2 | 5/2011 | Yoshida et al. | |
| 8,084,773 B2 | 12/2011 | Sung | |
| 8,278,755 B2 | 10/2012 | Tain et al. | |
| 8,391,662 B1 | 3/2013 | Jones et al. | |
| 8,784,766 B1 | 7/2014 | Uppireddi et al. | |
| 8,963,293 B2 | 2/2015 | Botula et al. | |
| 9,159,641 B2 | 10/2015 | Hobart et al. | |
| 9,469,918 B2 | 10/2016 | Xu et al. | |
| 2005/0179126 A1 | 8/2005 | Ravi et al. | |
| 2006/0113545 A1 | 6/2006 | Weber et al. | |
| 2006/0124349 A1 | 6/2006 | Fujimura et al. | |
| 2006/0216514 A1 | 9/2006 | Fujimura et al. | |
| 2007/0257265 A1 | 11/2007 | Naguib et al. | |
| 2007/0269964 A1 | 11/2007 | Sung | |
| 2008/0206569 A1 | 8/2008 | Whitehead et al. | |
| 2009/0189184 A1 | 7/2009 | Sung | |
| 2010/0295128 A1 | 11/2010 | Daghighi | |
| 2011/0186840 A1 | 8/2011 | Jerome et al. | |
| 2012/0168773 A1 | 7/2012 | Sung | |
| 2012/0288698 A1* | 11/2012 | Moldovan | H01L 23/3732 428/141 |
| 2013/0168835 A1 | 7/2013 | Botula et al. | |
| 2014/0124902 A1 | 5/2014 | Botula et al. | |
| 2014/0264777 A1 | 9/2014 | Hobart et al. | |
| 2015/0348866 A1 | 12/2015 | Hobart et al. | |
| 2015/0376804 A1 | 12/2015 | Gorokhovsky et al. | |
| 2016/0333472 A1 | 11/2016 | Xu et al. | |

FOREIGN PATENT DOCUMENTS

| | | |
|---|---|---|
| JP | 2005306617 A | 11/2005 |
| JP | 2006507204 A | 3/2006 |
| JP | 2006206971 A | 8/2006 |
| JP | 2007537127 A | 12/2007 |
| KR | 0170536 B1 | 3/1999 |
| KR | 20070114218 A | 11/2007 |

OTHER PUBLICATIONS

Prawer et al., "Raman spectroscopy of diamond and doped diamond", Philosophical Transactions Series A: Mathematical, Physical, and Engineering Sciences, 2004, pp. 2537-2565; vol. 362, No. 1824.

Zaitsev, Optical Properties of Diamond: A Data Handbook, 2001, 501 pages, Springer-Verlag Berlin Heidelberg, New York, US.

\* cited by examiner

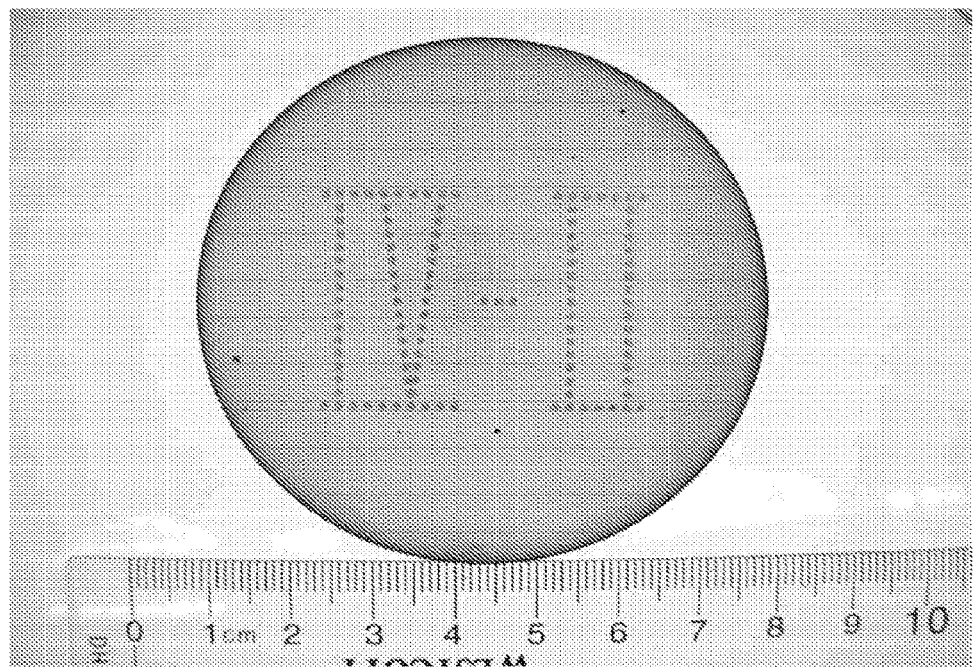
FIG. 4A
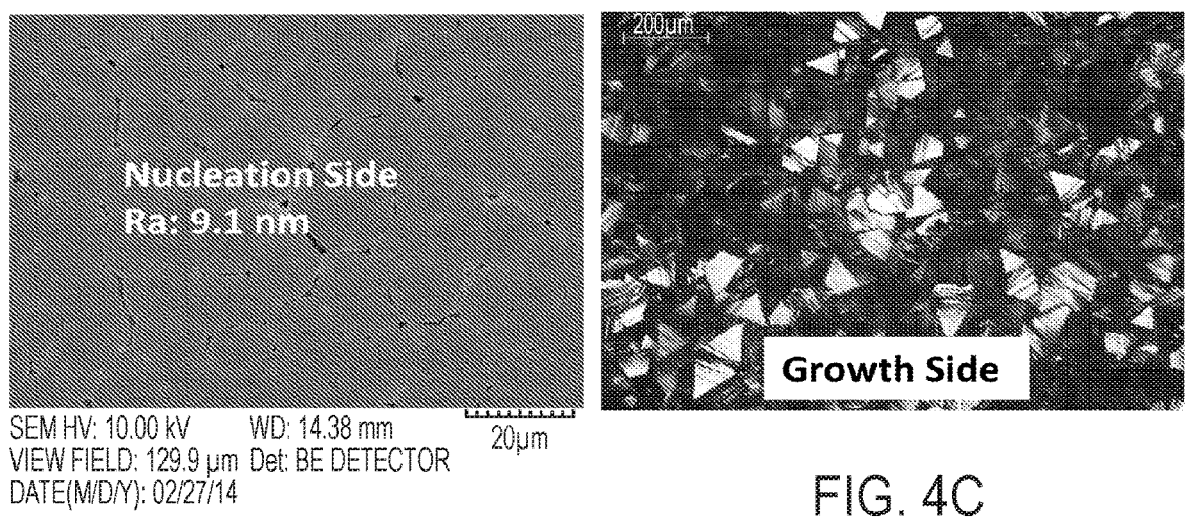
FIG. 4B
FIG. 4C

INTERFEROMETER ROUGHNESS MEASUREMENT RESULTS OF POLISHED DIAMOND GROWTH SURFACE OF DIAMOND ON SILICON SUBSTRATE

INTERFEROMETER ROUGHNESS MEASUREMENT OF DIAMOND NUCLEATION SIDE SURFACE

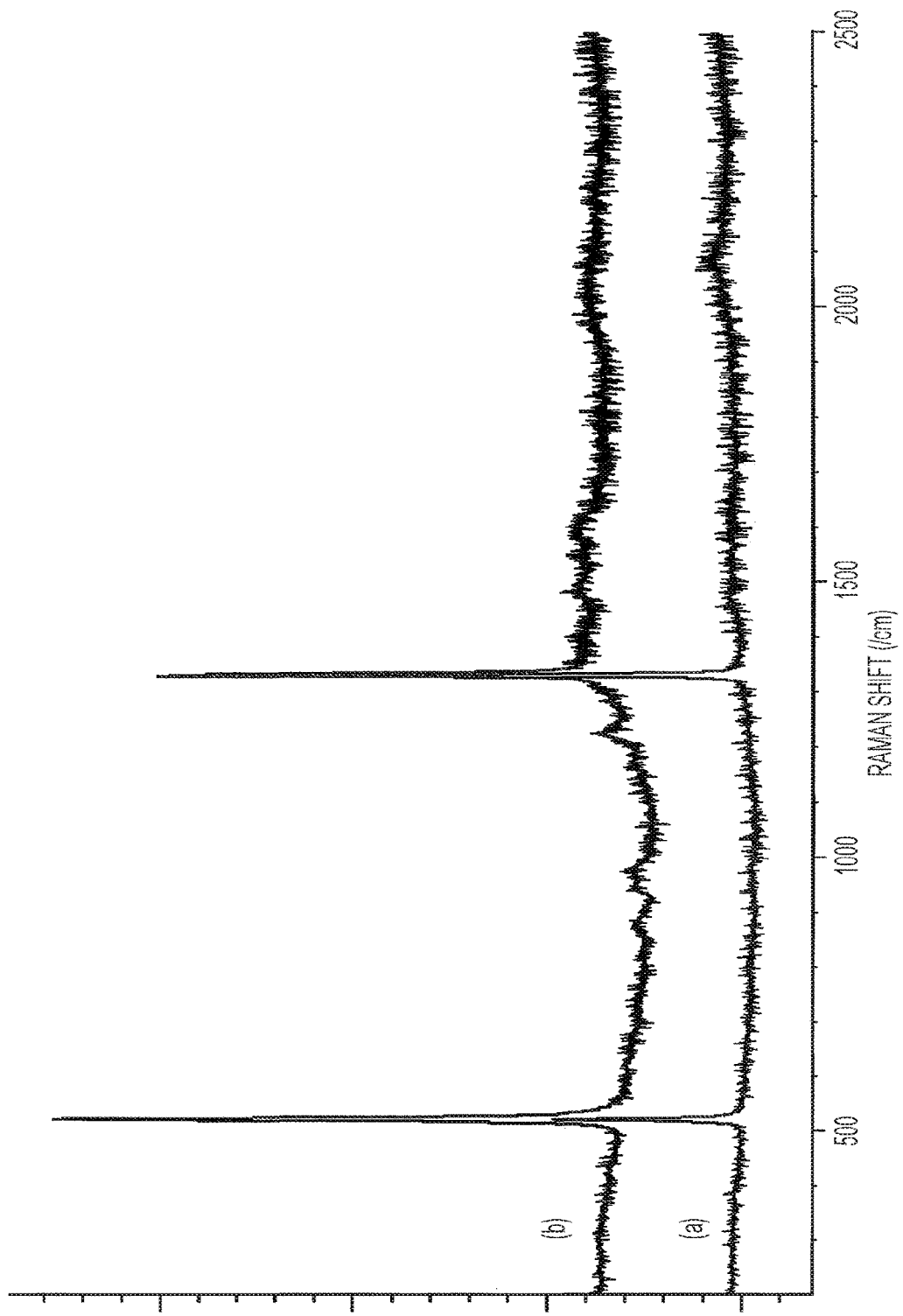

METHOD OF FORMING A MULTILAYER SUBSTRATE COMPRISING A LAYER OF SILICON AND A LAYER OF DIAMOND HAVING AN OPTICALLY FINISHED (OR A DENSE) SILICON-DIAMOND INTERFACE

CROSS REFERENCE TO RELATED APPLICATIONS

This application is a continuation of Ser. No. 16/750,753, filed Jan. 23, 2020, which is a division of U.S. patent application Ser. No. 15/450,110, filed on Mar. 6, 2017, which claims the benefit of U.S. Provisional Patent Application No. 62/305,197, filed Mar. 8, 2016, the disclosures of each of which are incorporated herein by reference in their entireties.

BACKGROUND OF THE INVENTION

Field of the Invention

The present invention concerns a method of making a substrate comprising a layer of silicon and a layer of diamond having an optically finished silicon-diamond interface and, optionally, an optically finished diamond surface. It also describes applications for said substrate.

Description of Related Art

Diamond is one of the hardest materials known, having a Mohs Hardness of 10, which makes diamond most useful for applications such as cutting, machining, drilling, milling, etc. Diamond is also one of the most thermally conductive materials known, having a thermal conductivity up to 2000 to 2200 watts per meter per Kelvin, which makes it a desirable material for applications in thermal management under demanding conditions. Diamond also has an extremely low coefficient of friction, which makes it a versatile material for uses such as brakes. With diamond on diamond, it is the low wear coefficient and lubricating uses under extreme conditions which makes it advantageous. Diamond also has desirable optical material for transmitting microwave, infrared, visible, and other ultraviolet electromagnetic waves. Diamond also has high stability when used as detector for high fluence nuclear radiation. In addition, diamond is also a highly inert material in a chemical environment that can involve strong acid, strong base, strong oxidizing agent, or strong reducing agent, even at elevated temperatures or at cryogenic conditions. Furthermore, diamond has a high refractive index, which leads to its use in the jewelry industry.

In addition, the acoustic velocity for diamond is 18,500 m/s, which is much higher than that for single crystal silicon (8,500 m/s) and for silicon carbide (13,300 m/s), as shown in Table 1, below. Acoustic velocity is an intrinsic property of a material that is considered when making an acoustic wave resonator. An acoustic resonator is widely used as a RF filter, an RF oscillator, a RF MEMS switch, and a microsystem (sensor). The resonance frequency of an acoustic resonator is directly proportional to the acoustic velocity of the material and inversely proportional to the geometric dimension of the resonator. The resonator (with a given geometry) that is made of diamond resonates at a frequency that is 2.2 times of that of a resonator made of silicon. Hence, for a given resonant frequency, a resonator made of diamond can have a geometric dimension that is about 2.2 times smaller than the geometric dimension of a resonator made of silicon. A diamond resonator can also have a lower energy loss during vibration, as compared to a silicon resonator, which is measured by a quality factor, Q. The theoretical Q for diamond is around 380,000, as compared to that for silicon, which is around 36,000. The higher the Q value is, the lower the energy loss is during vibrations.

TABLE 1

Comparison of Acoustic Velocities and Theoretically Predicted Quality Factors at 1 GHz and 3 GHz*.

| Material | $v_a$ (m/S) | Q Theory @ 1 GHZ | Q Theory @ 3 GHZ |
|---|---|---|---|
| Diamond | 18,500 | 380,000 | 380,000 |
| SiC | 13,300 | 320,000 | 116,000 |
| Quartz | 5,720 | 39,000 | 13,000 |
| Si | 8,500 | 36,000 | 36,000 |
| AlN | 10,970 | 8,700 | 3,400 |

*Ivan Rivera, RF MEMS Resonators for Mass Sensing Applications (PhD Dissertation), Feb. 2015.

Therefore, it is desirable for a diamond acoustic wave resonator to have both high quality diamond and a high quality diamond surface, which facilitates achieving a higher resonant frequency, a higher Q value (or a low power loss for low power consumption), or a higher frequency Q product.

Industrially, diamond can be grown in reactors in a process called chemical vapor deposition (CVD), where suitable growth conditions can be achieved by microwave-enhanced plasma, tungsten hot-filament, DC-Jet plasma, laser-induced plasma, acetylene-torch, etc.

In many diamond applications, the surface of a substrate comprising diamond needs to be finished optically smooth for the purpose of use as a sound wave medium, or as a substrate to reflect light/electromagnetic waves, or conduct heat energy away from electronics, photonics, or optoelectronics via certain type of bonding mechanisms such as brazing or gluing. Since diamond is one of the hardest materials known, polishing diamond can be a slow and expensive process in which a substrate comprised of diamond undergoes stress and, at the same time, heat is generated. Moreover, diamond is also fragile and easy to shatter. The heat and stress that are generated during polishing of a diamond film can lead to delamination or partial delamination of a diamond film comprising a substrate.

There is a substantial mismatch in coefficient of thermal expansion between diamond (about $1 \times 10^{-6}$ m/m–K) and silicon (about $3 \times 10^{-6}$ m/m–K). Diamond film typically grows on a silicon substrate at an elevated temperature. At the end of the diamond film growth process, the substrate comprising a layer of diamond and a layer of silicon cools from a diamond growth temperature to room temperatures. Diamond shrinks much less than silicon, which can lead to substantial stress between the diamond layer and the silicon layer, where diamond suffers a compression stress and silicon suffers a tensile stress. Such CTE mismatch stress increases with the geometric dimension of the substrate comprising a layer of diamond and a layer of silicon. When the stress reaches a certain level, the diamond layer can delaminate from the silicon layer. Often times, the delaminated diamond layer shatters into many irregular small pieces due to the compression stress, or the silicon layer, e.g., silicon wafer, suffers cracking due to the tensile stress.

SUMMARY OF THE INVENTION

The substrate disclosed herein comprises a layer of silicon and a layer of diamond having an optically finished silicon-diamond interface (or a dense diamond-silicon interface with a diamond grain density of $10^9/cm^2$ or greater) and, optionally, an optically finished diamond surface. The surface roughness (Ra) of the diamond surface at the silicon-diamond interface can be ≤100 nm, ≤50 nm, ≤30 nm, ≤20 nm, ≤10 nm, or ≤5 nm. The surface roughness of the silicon surface at the silicon-diamond interface can be ≤100 nm, ≤50 nm, ≤30 nm, ≤20 nm, ≤10 nm, ≤5 nm, ≤2 nm, or ≤1 nm. The surface roughness of the diamond surface opposite to the interface can be ≤100 nm, ≤50 nm, ≤30 nm, ≤20 nm, ≤10 nm, or ≤5 nm. The thickness of the diamond layer of said substrate can be ≤5 microns, ≤10 microns, ≤20 microns, ≤50 microns, ≤100 microns, ≤200 microns, ≤500 microns, or ≤2,000 microns. The thickness of the silicon layer of said substrate can be ≥10 microns, ≥50 microns, ≥100 microns, ≥200 microns, ≥500 microns, ≥2,000 microns, or ≥5,000 microns. The diameter of said substrate can be ≥1" (25.4 mm), ≥2" (50.8 mm), ≥3" (76.2 mm)≥, 4" (101.6 mm), ≥5" (127 mm), or ≥6" (152.4 mm). The overall thickness of said substrate can be ≥50 microns, ≥100 microns, ≥150 microns, ≥250 microns, ≥500 microns, ≥1 mm, ≥3 mm, or ≥5 mm.

The diamond layer can be doped or undoped, polycrystalline, nanocrystalline, or ultrananocrystalline. The silicon layer can be doped or undoped, polycrystalline, monocrystalline, etc. The diamond quality can have Raman half-height-peak-width of ≤20 $cm^{-1}$, ≤15 $cm^{-1}$, ≤10 $cm^{-1}$, or ≤7 $cm^{-1}$.

Also disclosed are growth conditions for making the substrate disclosed herein comprising a layer of silicon and a layer of diamond having an optically finished silicon-diamond interface (or a dense diamond-silicon interface) and, optionally, an optically finished diamond surface.

BRIEF DESCRIPTION OF THE DRAWINGS

FIG. 4A is a photograph of a diamond film that was grown conformingly onto a silicon substrate that included the pattern "II-VI" formed in the growth surface of the silicon substrate;

FIGS. 4B and 4C are close-up views of the nucleation side and growth side of the diamond film shown in FIG. 4A;

FIG. 11 are Raman spectra of the as-grown diamond surface and the polished diamond surface on the silicon substrate of the diamond on silicon substrate of Example 6 herein.

DESCRIPTION OF THE INVENTION

Various non-limiting examples will now be described with reference to the accompanying figures where like reference numbers correspond to like or functionally equivalent elements.

Figure 1:
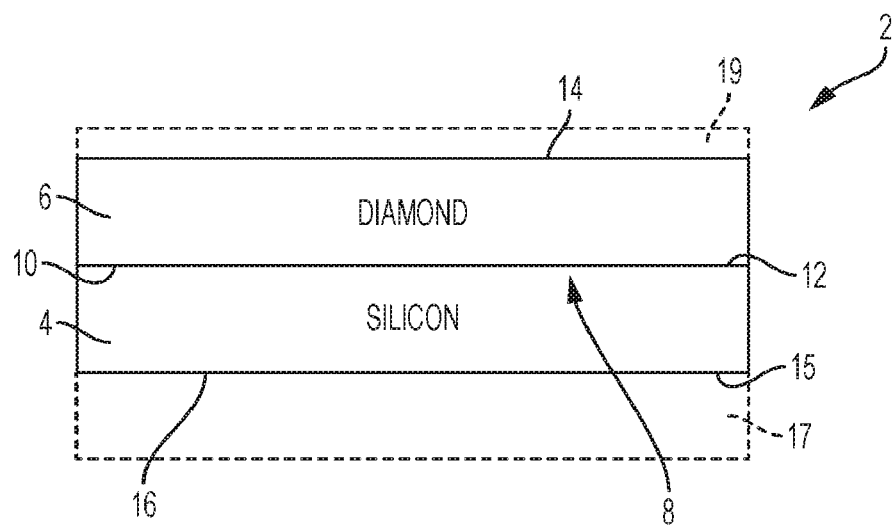
FIG. 1 is a schematic of an example substrate comprised of a layer of silicon and a layer of diamond having an optically finished silicon-diamond interface and, optionally, an optically finished diamond surface.

With reference to FIG. 1, in an example, a composite substrate 2 comprises a layer of silicon 4 and a layer of diamond 6, wherein an interface 8 between the silicon layer and diamond layer can be optically finished or physically dense with a substantially absence of voids or gaps among the diamond grains. More specifically, a diamond surface 10 at the silicon-diamond interface 8 can be optically finished (can be characterized by removing the silicon layer 4 allowing the diamond interface surface to be exposed), or physically dense with a substantial absence of voids or gaps among the diamond grains. The surface roughness (for the optically finished interface) (Ra) of the diamond surface 10 at the silicon-diamond interface can be ≤100 nm, ≤50 nm, ≤30 nm, ≤20 nm, ≤10 nm, or ≤5 nm. For a lapped, grounded or etched silicon surface at the interface, the diamond-silicon interface can be characterized by the presence of voids or gaps among the diamond grains, which can be characterized by the diamond grain density. The diamond grain density can be ≥$10^4/cm^2$, ≥$10^5/cm^2$, ≥$10^6/cm^2$, ≥$10^7/cm^2$, ≥$10^8/cm^2$, or ≥$10^9/cm^2$. The surface roughness (Ra) of the silicon surface (for the optically finished silicon) at the silicon-diamond interface can be ≤100 nm, ≤50 nm, ≤30 nm, ≤20 nm, ≤10 nm, ≤5 nm, ≤2 nm, or ≤1 nm. The surface roughness, Ra, for a silicon surface at the silicon-diamond interface 8 can be determined by the roughness of the same silicon surface prior to diamond growth.

For applications of substrate 2 in an acoustic wave resonator, a dense layer of diamond at the silicon-diamond interface allows the acoustic wave to transport with a minimal scattering. Otherwise an acoustic wave would be damped in a porous media.

The optically finished silicon-diamond interface also allows precision control of the geometric dimension of the resonator, which in-turn controls an intrinsic acoustic resonance frequency (a critical parameter for a RF communication filter, or oscillator, etc.).

For applications of substrate 2 in light wave management, a dense layer of diamond at the silicon-interface avoids light scattering and an optically finished surface allows precision control of light reflection, refraction, and transmission. For applications of substrate 2 in thermal management, a dense diamond at the silicon-diamond interface avoids slow heat conduction in the gas phase or in vacuum in the voids or gaps among the diamond grains, taking an advantage of fast phonon transport in diamond media, achieving high performances of thermal management.

Optionally, diamond surface 14 (opposite the silicon-diamond interface 8) of substrate 2 can be optically finished. The optically finished diamond surface 14 can be achieved by a polishing process. The surface roughness (Ra) of diamond surface 14 can be ≤100 nm, ≤50 nm, ≤30 nm, ≤20 nm, ≤10 nm, or ≤5 nm. The optical finishing of the diamond surface 14 can be a factor in optical management for light control, thermal management for bonding to a heat source, acoustic wave management for precision control of geometric dimensions, and for building piezoelectric and electrode structures for achieving desirable acoustic wave resonance control and performance.

The silicon surface 16 (opposite the silicon-diamond interface 8) of substrate 2 having an optically finished (or dense) interface, and, optionally, an optically finished diamond surface 14, can be ground, etched, or optically polished.

In an example, the diamond layer 6 of substrate 2 can be of any thickness. In an example, the thickness of diamond layer 6 can be ≤5 microns, ≤10 microns, ≤20 microns, ≤50 microns, ≤100 microns, ≤200 microns, ≤500 microns, or ≤2,000 microns. In an example, the thickness of diamond layer 6 can be dictated by the precision needed in acoustic wave resonance, light transport control and/or efficiency in thermal management.

In an example, the silicon layer 4 of substrate 8 can be of any thickness. In an example, the thickness can be ≥10 microns, ≥50 microns, ≥100 microns, ≥200 microns, ≥500 microns, ≥2,000 microns, or ≥5,000 microns. The thickness of the silicon layer can be dictated by the needs of applications and the practical needs during the process of fabricating substrate 2.

Substrate 2 can have any geometric (largest) dimension. In an example, the largest dimension (e.g., diameter) can be ≥1" (25.4 mm), ≥2" (50.8 mm), ≥3" (76.2 mm), ≥4" (101.6 mm), ≥5" (127 mm), or ≥6" (152.5 mm). The diameter of substrate 2 can be selected and controlled so it can be handled in different fabrication processes.

Substrate 2 can have a thickness of ≥50 microns, ≥100 microns, ≥150 microns, ≥250 microns, ≥500 microns, ≥1 mm, ≥3 mm, or ≥5 mm. The thickness of the substrate can be dictated by the fabrication process to meet specific application needs.

The diamond layer 6 of substrate 2 can be undoped or doped, p-type or n-type, of a quality with Raman half-height-peak-width of ≤20 cm$^{-1}$, ≤15 cm$^{-1}$, ≤10 cm$^{-1}$, or ≤7 cm$^{-1}$. The diamond layer 6 can be polycrystalline, nanocrystalline, or ultrananocrystalline Doped and conductive diamond layer 6 can be used for a capacitive-drive acoustic resonance device. Doped and conductive diamond layer 6 can be used as an electrode material for high-frequency high-Q resonance media for acoustic wave management. The quality of diamond layer 6 can also be selected to achieve a desired level of intrinsic acoustic velocity and low power loss in acoustic resonance. The quality of diamond layer 6 can also effect light wave absorption and the thermal conductivity, dictated by the needs in optical and thermal applications.

The silicon layer 4 of substrate 2 can be undoped or doped, p-type or n-type, monocrystalline or polycrystalline. For single crystal silicon, silicon layer 4 can be cut from any crystal directions. The type of silicon comprising silicon layer 4 can also be selected for acoustic wave management. In an example, a high-electric-resistance silicon layer 4 may be needed. In another example, an electrical conductive silicon layer 4 may be needed. Finally, in another example, a single or poly crystalline silicon layer 4 may be needed.

The growth of diamond layer 6 of substrate 2 can be performed by any diamond growth process, including, but not limited to, microwave plasma-enhanced chemical vapor deposition (CVD), DC-Arc-Jet-plasma CVD process, hot-filament CVD process, laser-induced plasma CVD process, acetylene-torch CVD process, etc.

Substrate 2 can have an aspect ratio of ≥5, ≥10, ≥15, ≥20, or ≥30, where the aspect ratio is defined as the ratio of the longest or largest geometric dimension of substrate 2 (such as diameter) over the thickness of substrate 2. In an example, the larger the aspect ratio of substrate 2, the more difficult it is to make said substrate 2, particularly giving the constraints in the fabrication process and the level of CTE mismatch between diamond 6 and silicon 4 materials.

Figure 2:
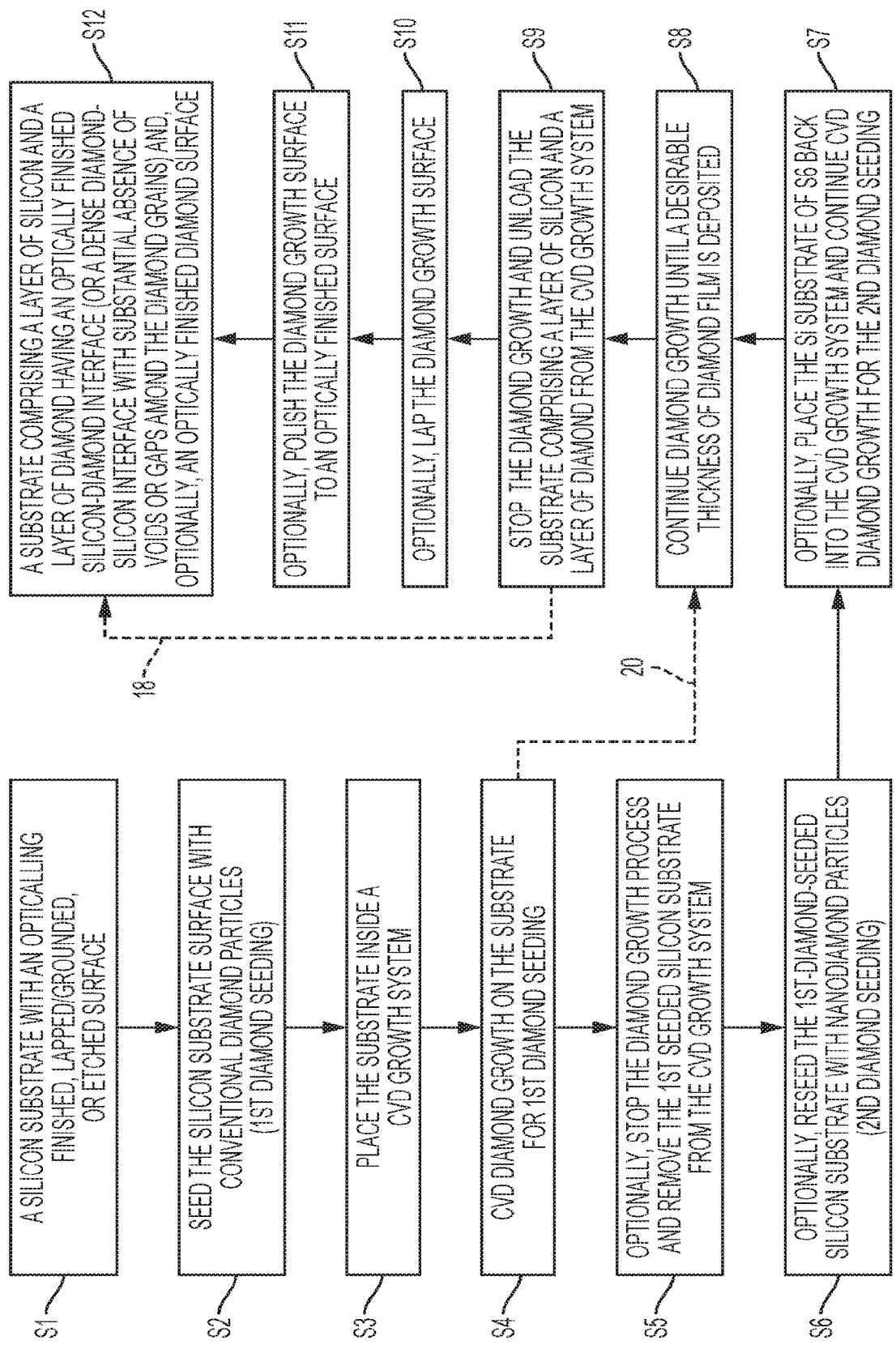
FIG. 2 is flow diagram of a process of producing the substrate of FIG. 1.

The process for producing substrate 2 comprising a layer of silicon 4 and a layer of diamond 6 having an optically finished (or dense) silicon-diamond interface 8 and, optionally, an optically finished diamond surface 14 is shown in the flow diagram of FIG. 2.

With reference to FIG. 2, in step S1, the surface 12 (for diamond film growth) of the silicon substrate 4 can be ground or lapped, chemically etched, or optically polished with a chemical-mechanical polishing slurry. In step S2, the silicon surface 12 can be seeded with conventional diamond powders (having a particle size ranging from sub-microns to tens microns) by ultrasonic treatment of the silicon layer 4 with a slurry made out of the diamond particles and a liquid media (such as water, methanol, ethanol, isopropanol, or any liquid media) or gentle rubbing without generating deep surface scratches. The seeding can also be achieved by a BIAS-enhanced seeding method.

Figure 3:
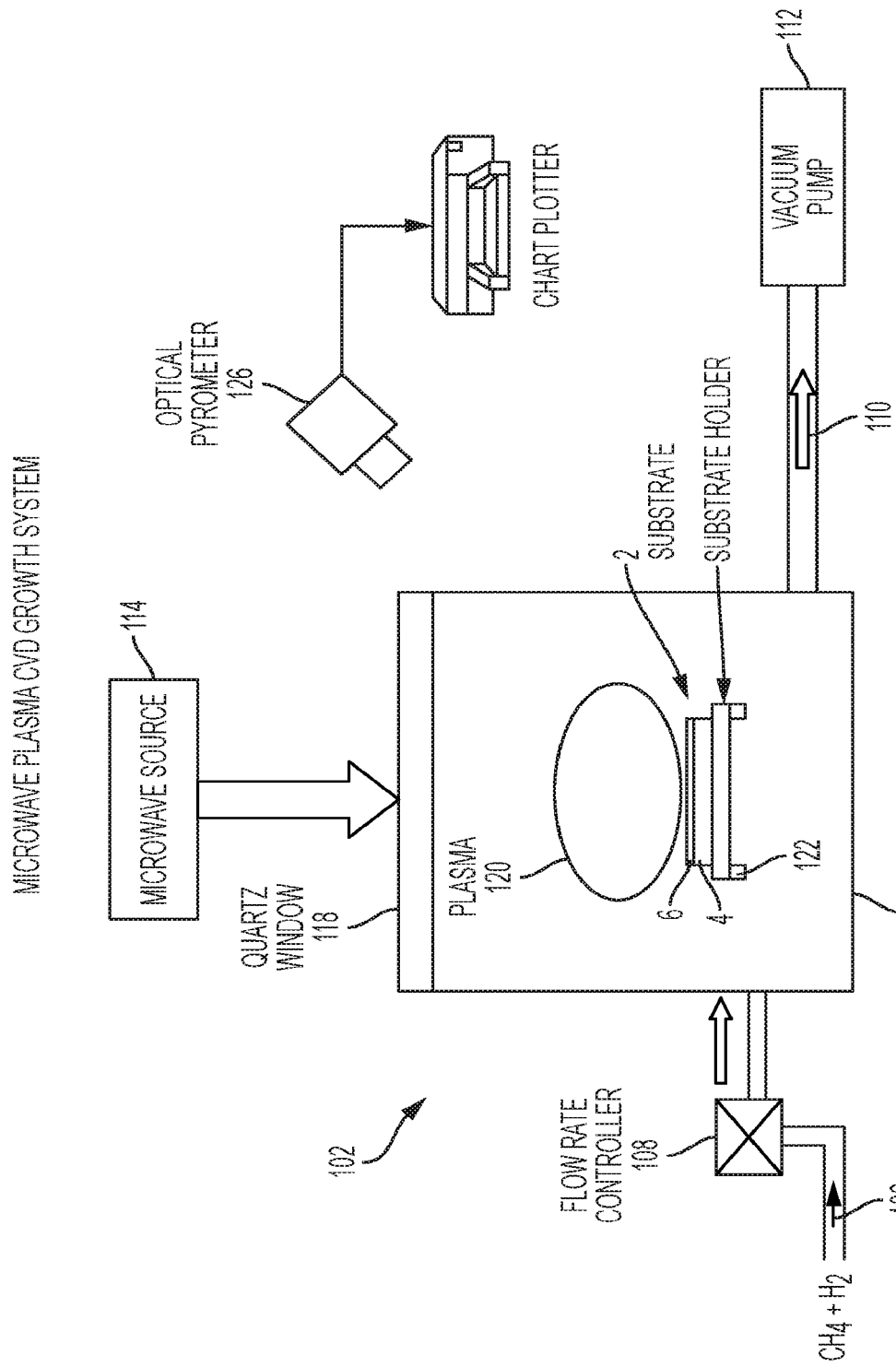
FIG. 3 is a schematic diagram of an example microwave plasma chemical vapor deposition (CVD) system that can be used for depositing the diamond layer on the silicon layer of the substrate shown in FIG. 1.

In step S3, the silicon substrate 4 can then be placed inside a CVD growth system (such as the CVD reactor shown schematically in FIG. 3). At step S4, the diamond growth process can be started and, at step S8, can continue for a period of time to attain a desired thickness and density of small diamond crystals that bond to the surface of the silicon substrate.

Once a desired thickness and density of diamond growth is complete, in step S9 the growth of diamond layer 6 is stopped and substrate 2, comprising silicon layer 4 and diamond layer 8 is unloaded from the CVD growth system. In steps S10 and S11, the growth surface of diamond layer 6 can be optionally lapped (S10) and optionally polished (S11) to an optical finish. As steps S10 and S11 are optional, these steps can be omitted if desired. If steps S10 and S11 are omitted, the process for producing substrate 2 can advance from step S9 directly to step S12 as shown by dashed line 18 in FIG. 2. As shown in step S12, substrate 2 comprising a layer of silicon 4 and a layer of diamond 6 has an optically finished silicon-diamond interface. Substrate 2 can also have a dense diamond-silicon interface with substantial absence of voids or gaps among the diamond grains. Finally, substrate 2 can optionally have an optically finished diamond (nucleation) surface 14.

As shown in FIG. 2, the process for producing substrate 2 can also include, between steps S4-S8, steps S5-S7. In step S5, the CVD diamond growth process can be optionally stopped and substrate 2 including a portion of diamond layer 6 CVD grown on silicon layer 4 in step S4 can be removed from the CVD growth system. In step S6, the portion of the diamond layer 6 CVD deposited on silicon layer 4 in step S5 can be reseeded or seeded again with nanodiamond particles.

In step S7, substrate 2 including the portion of the diamond layer 6 reseeded with nanodiamond particles in step S6 can be placed back into the CVD growth system wherein additional portions of diamond layer 6 can be grown atop of the reseeded portion of diamond layer 6 previously grown.

Because steps S5-S7 are optional, these steps can be omitted if desired whereupon, assuming steps S5-S7 are omitted, the method proceeds directly from step S4 to S8 as shown by dashed line 20 in FIG. 2.

Chemical vapor deposition of diamond by microwave plasma is well known in the art. FIG. 3 shows a schematic diagram of an example microwave plasma CVD growth system 102 that can be used to grow diamond layer 6 on silicon layer 4. In use of CVD growth system 102, silicon layer 4 is first placed on a substrate holder 122 at the base of a CVD reactor 116 of CVD growth system 102. Thereafter, a mixture of reactive gases 106, comprising hydrogen and methane, is flowed into the CVD reactor 116. The flow rate of the mixture of reactive gases 106 is controlled by a mass flow controller 108. Exhausted gas 110 flows out CVD reactor 116, typically to a vacuum pump 112. Microwave energy is typically generated by a microwave source, e.g., a magnetron, 114 and is guided to CVD reactor 116 through a quartz window 118. Inside CVD reactor 116, the microwave energy is converted into a plasma 120 which radicalizes hydrogen molecules of reactive gases 106 into hydrogen free radicals, as well as methane molecules of reactive gases 106 into methyl free radicals, methylene free radicals, methyne free radicals, and secondary or tertiary free radicals that contain two or more carbons. At the bottom of CVD reactor 116 sits substrate holder or support 122 that initially supports silicon layer 4 on which diamond layer 6 grows.

While plasma 120 is on, the radicalized free radicals that contain carbon species bombard the surface of silicon layer 4, which leads to fixation of the carbon species by a mechanism called "hit and stick". After a suitable length of time in the presence of plasma 120, diamond layer 6 grows to a suitable thickness.

It is well known in the art that the concentration of hydrogen and methane in the mixture of reactive gases 6 are parameters that affect diamond growth, in addition to the growth temperature (which can be measured by an optical parameter 126). Desirably, the plasma's 120 size is tuned to a size that is large enough to cover the upward facing surface of silicon layer 4. The microwave power and pressure inside of CVD reactor 116 are substrate-size-dependent. A person skilled in the art should be able to tune plasma 120 to a proper size that is large enough to cover silicon layer 4 of different sizes for the purposes of growing quality diamond film 6.

This first step seeding (S2 in FIG. 2) helps achieve good adhesion of diamond film 6 on silicon substrate 4. The first step seeding (S2 in FIG. 2) leads to diamond at the silicon-diamond interface having some voids and gaps among the diamond grains. In general, the voids or gaps among the diamond grains at the silicon-diamond interface are not desirable for a high frequency and high Q (low power loss) acoustic wave resonator, or for a controllable optical management (low scatter), for an effective thermal management (high heat transfer). To help avoid the formation of voids or gaps at the silicon-diamond interface, the process shown in FIG. 2 can optionally include the second step diamond seeding (S5-S7 in FIG. 2). In the second step of diamond seeding, the silicon substrate of the first step is taken out of the reactor after the diamond growth process is stopped. The silicon substrate can then be seeded again using one or more nanodiamond slurries and ultrasonic treatments. Such nanodiamond slurries can be made of nanodiamond powders along with a liquid medium, such as water, methanol, ethanol, isopropanol, or any inorganic/organic liquid media. Then, the nanodiamond-seeded silicon substrate can then be placed back into the CVD growth system (reactor), followed by re-starting the diamond growth process (S8 in FIG. 2) on the nanodiamond-seeded silicon substrate. Nanodiamond seeding can lead to formation of an optically finished silicon-diamond interface (if using an optically-finished silicon substrate), or a dense silicon-diamond interface and reduced gaps or voids over substrate 2 comprising a layer of silicon 4 and a layer of diamond 6 grown without the second step diamond seeding (S5-S7). Diamond film growth (S8 in FIG. 2) then continues inside the CVD growth system until a desirable thickness of diamond film 6 is achieved.

In an example, it was observed that one step diamond seeding with nanodiamond powders alone leads to weak adhesion of diamond film 6 to an optically-finished silicon substrate 4, leading to diamond film 6 delamination or partial delamination after the CVD growth system is shut down or during polishing in which substantial heat and stress are applied on substrate 2 comprising diamond layer 6 and silicon layer 4. Such adhesion and delamination problems get magnified as the diameter of substrate 2 increases.

The two-step diamond seeding described above allows for stronger bonding at the silicon-diamond interface 8 that can withstand the heat and stress resulting from post-diamond-surface-polishing, avoiding the diamond layer 6 from delaminating from the silicon layer 4. At the same time, in the case of using a silicon layer 4 having an optically finished surface 12, an optically-finished silicon-diamond interface can be achieved for substrate 2 and, optionally, an optically finished diamond growth surface 14.

In the case of using a ground/lapped or chemically etched silicon surface 12, the diamond nucleation surface 10 at the silicon-diamond interface 8 can be dense with minimal voids or gaps among diamond grains, evidenced by a diamond grain density at the silicon-diamond interface 8 of $\geq 10^4/cm^2$, $\geq 10^5/cm^2$, $\geq 10^6/cm^2$, $\geq 10^7/cm^2$, $\geq 10^8/cm^2$, or $\geq 10^9/cm^2$. After substrate 2 is taken out of CVD reactor 116, diamond growth surface 14 can be optionally lapped (S10 in FIG. 2), and, optionally, optically polished (S11 in FIG. 2) whereupon the thickness of silicon layer 4 can be reduced to a desirable thickness.

The examples described herein use a silicon layer 4 that can be large in one dimension (diameter). The coefficient of thermal expansion for silicon is about $3.0 \times 10^{-6}$ meter/meter-Kelvin, while the coefficient of thermal expansion for diamond is about $1.0 \times 10^{-6}$ meter/meter-Kelvin. Moreover, diamond typically grows at elevated temperatures. During shutting down of CVD diamond growth, the temperature drops substantially from diamond growth temperature to room temperatures. The CTE mis-match between diamond layer 6 and silicon layer 4 leads to substantial stress between diamond layer 6 and silicon layer 4. This can be severe when silicon layer 4 is large in dimension. In addition, unlike metallic substrates such as tungsten and molybdenum, silicon is brittle and cannot survive plasma start-up during CVD growth of diamond layer 6 on silicon layer 4. In an example, silicon wafers (6" (152.4 mm) in diameter and 625 microns in thickness) were tried as silicon layers 4 for diamond growth. Unfortunately, these silicon wafers shattered every time during the early stage of the plasma 120 tuning process in CVD reactor 116. It was observed that only a piece of thick silicon layer 6 survived the plasma start-up tuning process. In an example, a silicon layer 4 that can survive the plasma start-up tuning process is $\geq 1$ mm in thickness, $\geq 2$ mm in thickness, $\geq 4$ mm in thickness, $\geq 6$ mm in thickness, or $\geq 8$ mm in thickness.

As shown in FIG. 1, silicon layer (wafer) 4 can be bonded using a bonding reagent 15 to a thicker substrate 17, such as, for example, another silicon substrate, a graphite substrate, a metallic substrate, a ceramic substrate, or a glass substrate, etc. By bonding on to thicker substrate 17, silicon layer 4 can survive the plasma start-up without shattering, or bowing up in the center, or "potato-chip" deformation.

The bonding reagent 15 can comprise a polymer, a carbon-based material, a silicate or silicate-based material, a metallic based material such as silver, gold, platinum, nickel, or copper, etc.

The silicon layer 4 and/or the diamond layer 6 of substrate 2 can be partially removed, e.g., etched away. In case of partial removal of silicon layer 4, the diamond surface 10 at the silicon-diamond interface 8 can be exposed. Such diamond surface 10 can be dense with minimal or no voids or gaps among the diamond grains. If the silicon surface 12 is optically finished, the diamond surface 10 in the silicon-diamond interface 8 can also have an optically finish having a surface roughness, Ra, ≤100 nm, ≤50 nm, ≤30 nm, ≤20 nm, ≤10 nm, or ≤5 nm.

In another example, diamond layer 6 can be used as a substrate or window. The diamond layer 6 can have a 1.06 micron light scattering coefficient (at a distance of 34 cm from a blocking lens) of ≤20/cm, ≤15/cm, ≤10/cm, ≤7/cm, or ≤5/cm, which can be desirable for optical applications, thermal management applications, acoustic management applications, etc.

In another example, diamond layer 6 can have a diamond nucleation density ≥$1.0\times10^5$/cm$^2$, or ≥$1.0\times10^6$/cm$^2$, or ≥$1.0\times10^7$/cm$^2$, or ≥$1.0\times10^8$/cm$^2$, or ≥$1.0\times10^9$/cm$^2$, which can also be desirable for transporting acoustic waves for acoustic management, transporting phonons for thermal management, transporting photons for light management. Said diamond nucleation density can also be desirable for mechanical applications. Said diamond nucleation can result in diamond film 6 having a low porosity for chemical inertness, and properties favorable for surface friction controls. Another example can be to polish the as-grown diamond surface 14 while diamond layer 6 is still on silicon layer 4. In this case, the total thickness of diamond layer 6 and silicon layer 4 is thick enough to allow a conventional polishing process to hold and polish substrate 2 without shattering diamond layer 6 during the polishing process. After achieving an optical finish on surface 14 of diamond layer 6, substrate 2 can go through a thinning process (on the silicon layer 4 side). At the end of this process, a thin piece of substrate 2 comprising silicon layer 4 and diamond layer 6 having an optically finished (or dense) silicon-diamond interface 8 and, optionally, an optically finished diamond surface 14 can be produced.

In another example, after producing substrate 2 comprising silicon layer 4 and diamond layer 6 comprising an optically finished (or dense) silicon-diamond interface 8 and, optionally, a optically finished diamond surface 14, one or more light management coatings 19 such as, for example, an antireflective coating, a beam splitter coating, a total reflective coating, etc., or a layer of piezoelectric material along with certain type of electrode layer(s) for acoustic wave management, can be applied to any exposed surface, e.g., on surface 14 of diamond layer 6 as shown in FIG. 1. Such substrate 2 can also be further cut into different geometric dimensions for various applications.

The diamond layer 6 of substrate 2 can be of optical quality, having a low absorption of electromagnetic waves such as infrared light, near infrared light, visible light, or UV light, having an absorbance of ≤0.5/cm. It can also have a low loss tangent for microwave applications, for example a loss tangent of ≤$1\times10^{-2}$. It can also be mechanical and/or thermal grade diamond (which could be dark, having a thermal conductivity of, for example, ≥800 watt/m-K). It can also be detector grade diamond (having a charge collection distance of ≥100 micron) or electrochemical grade diamond (which requires doping with, for example, boron).

The diamond layer 6 of substrate 2 can be CVD grown via microwave-aided plasma CVD process, a hot-filament CVD process, a thermal spray CVD process, an arc discharge plasma CVD process, a direct current thermal plasma CVD process, a radio-frequency plasma CVD process, a water-based plasma CVD process, an acetylene touch plasma CVD process, a very high frequency plasma CVD process, etc.

The growth temperature of diamond layer 6 of substrate 2 can range from 600° C. to 1300° C. The growth rate for diamond layer 6 can be submicron per hour to 20 microns per hour. The methane concentration of the reactive gases 106 for growing diamond layer 6 can range from less than 1% to as high as 5% in hydrogen. Other additives of the reactive gases 106 can include oxygen, carbon monoxide, carbon dioxide, nitrogen, boron, etc. These other reactive gases additives can be added for the purpose of diamond growth rate control and/or diamond quality control.

The silicon layer 4 for diamond layer 6 growth, can be ≥30 mm in diameter, ≥2" (50.8 mm) in diameter, ≥66 mm in diameter, ≥3" (76.2 mm) in diameter, ≥4" (101.6 mm) in diameter, ≥5" (127 mm) in diameter 1 or ≥6" (152.4 mm) in diameter.

The thickness of the silicon layer 4 of said substrate 2 can be, ≥1 mm, ≥2 mm, ≥4 mm, ≥6 mm, or ≥8 mm.

The surface 16 of silicon layer 4 of substrate 2 can be optically finished, chemically etched, and/or mechanically finished, such as lapping and/or grinding. The surface roughness, Ra, of the optically finished surface 16 can be ≤20 nm, ≤15 nm, ≤10 nm, ≤5 nm, or ≤2 nm.

In another example, silicon surface 12 can optionally include a thin layer of dielectric film 13, such as, for example, $SiO_2$, SiN, or one or more other dielectric layers. Silicon substrate can be a silicon on insulator (SOI) wafer. The dielectric film 13 can be any thickness. In an example, dielectric film 13 can have a thickness suitable for a particular function such as, for example, supporting diamond film 6 to achieve a particular function as acoustic resonator for acoustic wave management. In an example, the thickness of dielectric film 13 can be between a few angstroms and 100 microns, between 1 nm and 50 microns, between 10 nm and 20 microns, or between 50 nm and 10 microns.

Each of the various example composite substrates 2 of diamond layer 6 and silicon layer 4 can be used in one or more the following applications: optical applications for light/electromagnetic wave management; as a substrate 2 for thermal management for electronics, photonics, and optoelectronics; as a substrate 2 for uses involving chemical inertness; as a substrate 2 for making an acoustic wave resonator including a surface and or bulk acoustic resonator; as a RF filter, an RF oscillator, a RF MEMS switch, or a MEMS sensor; in friction control; as a detector; and/or as a material for mechanical uses in, such as, for example, milling, cutting, drilling, lacing, etc.

The following examples and comparative examples are for the purpose of illustrating key elements but are not to be considered as limited by the following examples.

Method of Characterization

Scanning Electron Microscopy (SEM) images were collected on a Tescan Vega scanning electron microscope equipped with an energy dispersive analysis X-Ray (EDAX) detector.

Raman spectra were collected by a Renishaw Raman Microscope (confocal). Laser Raman spectroscopy is widely used as a standard for the characterization of diamond, single crystal or polycrystalline. It provides readily distinguishable signatures of each of the different forms (allotropes) of carbon (e.g., diamond, graphite, buckyballs, etc.). Combined with photoluminescence (PL) technology, it offers a non-destructive way to study various properties of diamond including phase purity, crystal size and orientation, defect level and structure, impurity type and concentration, and stress and strain. In particular, the full-width-half-maximum, FWHM of the first order diamond Raman peak at 1332 cm$^{-1}$, as well as the Raman intensity ratio between diamond peak and graphitic peaks (D-band at 1350 cm$^{-1}$ and G-band at 1600 cm$^{-1}$), is a direct indicator of diamond quality. Furthermore, the stress and strain levels in diamond grains and films can be estimated from diamond Raman peak shift. It has been reported that the diamond Raman peak shift rate under hydrostatic stress is about 3.2 cm$^{-1}$/GPa, with the peak shifting to lower wavenumber under tensile stress and higher wavenumber under compressive stress. The Raman spectra presented herein were collected using a Renishaw inVia Raman spectroscope with 514 nm excitation laser.

Surface roughness (Ra) and Peak-to-Valley (PV) measurements of the surface of a piece of polished diamond were obtained via a Zygo NewView 600 Interferometer with a 20× Objective lens. The measured area was 200 microns by 350 microns.

The scattering coefficient for 1.064 micron wavelength light was measured and determined by the ratio of the scattered light intensity collected at 34 mm distance from the sample (while the transmitted light is blocked) to the total light intensity including the transmitted light (i.e., without blocking the transmitted light), using an Nd-YAG solid state 1.064 micron wavelength laser.

Example 1: Producing Thin Diamond Substrate with One Surface Having an Optical Finish A piece of single crystal silicon substrate 4 of 66 mm in diameter and 11.5 mm in thickness was fabricated in a typical silicon fabrication process. Surface 12 of this silicon substrate 4 was diamond-turned to an optical-finish surface with a Ra of 6 to 7 nm. At the same time, a logo "II-VI" was also machined recessively by diamond-turning onto surface 12 of this silicon substrate 4. Then, this silicon substrate 4 was used as a substrate in microwave plasma CVD reactor 116 (FIG. 3), with the diamond-turned optically-finished surface (surface 12) facing in the direction where plasma 120 will be formed.

A mixture of 1,850 mL/min hydrogen and 13.6 mL/min methane was flowed into microwave plasma CVD reactor 116. After plasma ignition, the microwave power and the reactor pressure were tuned so that the plasma 120 size covered surface 12 of the silicon substrate 4. The diamond growth temperature at the center of surface 12 of silicon substrate 4 was controlled, e.g., via optical pyrometer 126, to 800° C. After 168 hours of diamond growth, the reaction was stopped. A polycrystalline diamond layer 6 of 285 microns cm thickness was conformingly deposited on surface 12 of the silicon layer 4. The silicon substrate 4 was then stripped off with a KOH solution at elevated temperatures, followed by HF—HNO$_3$ stripping, resulting in a piece of free-standing diamond film and with a diameter of 66 mm, a thickness of 285 microns, and an aspect ratio of 231. The nucleation surface 10 of the diamond layer 6 was measured to have a surface roughness (Ra) of 9.1 nm.

FIG. 4A is an image of this free-standing diamond layer 6 that is optically clear with surface finishing on the growth side 14, and the "II-VI" logo that grew conformingly onto the diamond-turned trenches of the silicon surface 12, demonstrating that any non-planar surface of a piece of diamond can be attained by growing diamond conformingly into the "Negative" surface of a sacrificial substrate (such as silicon layer 4) that can be fabricated by a conventional fabrication process, such as, for example, a diamond-turning process and an optics fabrication process that can involve grinding, lapping, ion etching and/or chemical mechanical polishing. In an example, the non-planar, nucleation diamond surface is of optical-finish. FIG. 4B is an enlarged view of the nucleation side 10 of the free-standing diamond layer 6 shown in FIG. 4A. FIG. 4C is an enlarged view of the growth side 14 of the free-standing diamond layer 6 shown in FIG. 4A.

A second piece of single crystal silicon substrate 4 of 66 mm in diameter and 11.5 mm in thickness was fabricated in a typical silicon fabrication process. Surface 12 of this silicon substrate 4 was also diamond-turned to an optical-finish surface with a Ra of 6 to 7 nm. Then, surface 12 of this silicon substrate 4 was ultrasonic-treated with a diamond-ethanol suspension slurry. This silicon substrate 4 was then used as a substrate in microwave plasma CVD reactor 116 (FIG. 3), with the diamond-turned optically-finished surface (surface 12) facing in the direction where plasma 120 will be formed.

A mixture of 1,850 mL/min hydrogen and 13.6 mL/min methane was flowed into the microwave plasma CVD reactor 116. After plasma ignition, the microwave power and the reactor pressure were tuned so that the plasma 120 size covered the surface 12 of silicon substrate 4. The diamond growth temperature at the center of surface 12 of silicon substrate 4 was controlled, e.g., via optical pyrometer 126, to 800° C. After 148 hours of diamond growth the reaction was stopped. A polycrystalline diamond layer 6 of 233 microns in thickness was conformingly deposited on surface 12 of the silicon layer 4. The silicon substrate 4 was then stripped off with a KOH solution at elevated temperatures, followed by HF—HNO$_3$ stripping, resulting in a piece of free-standing diamond film 6 with a diameter of 66 mm, a thickness of 233 microns and, an aspect ratio of 283. The nucleation surface 10 of the diamond film 6 was measured to have a surface roughness (Ra) of 11.5 nm.

Figure 5:
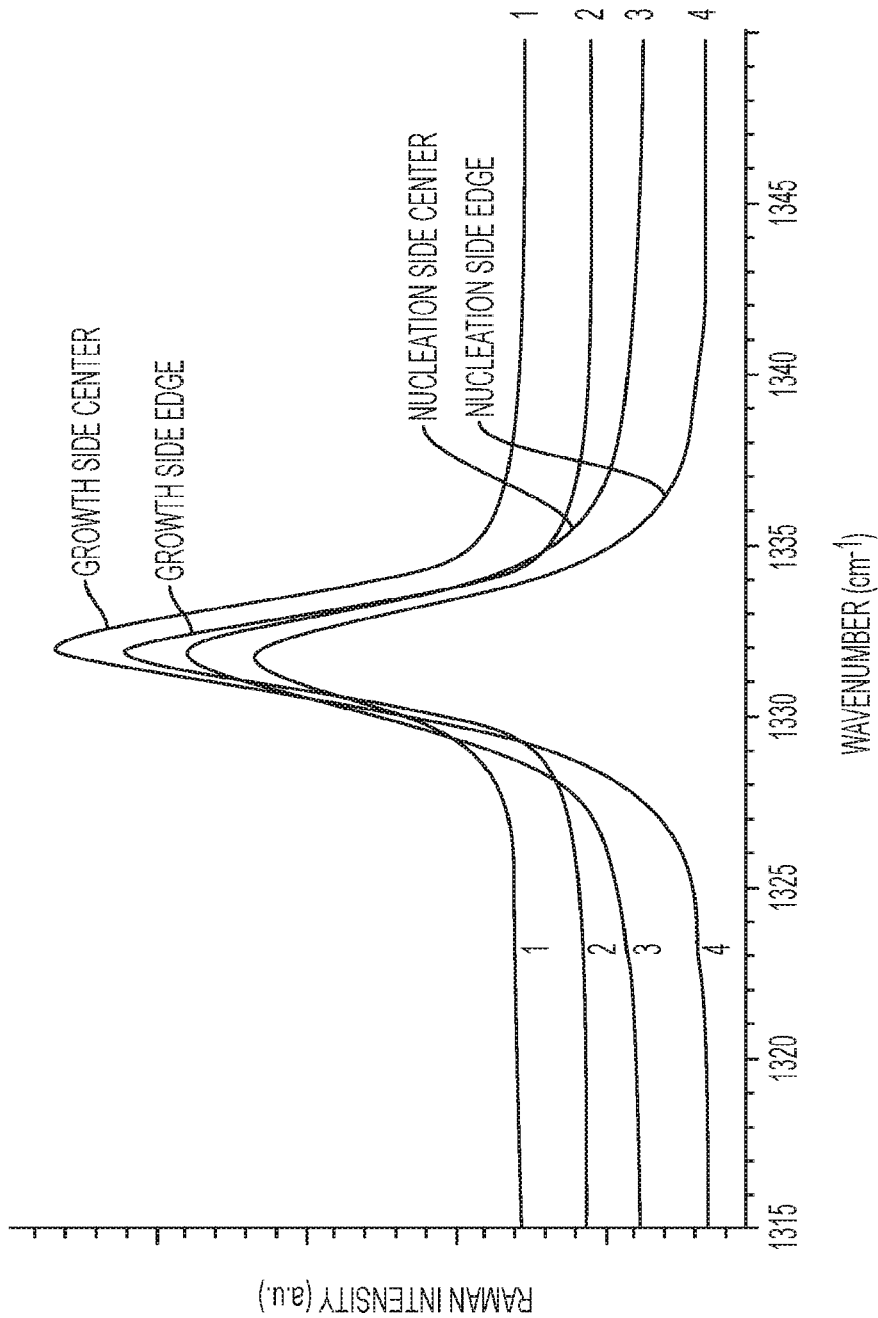
FIG. 5 is a graph of Raman intensity versus wavelength showing Raman graphs of the growth side center, growth side edge, nucleation side center, and nucleation side edge of the diamond film shown in FIG. 4A.

The quality of this latter diamond film 6 was studied via Raman spectroscopy. As shown in FIG. 5, the diamond crystals on the growth side 14 are of excellent quality, as evidenced by a narrow FWHM of 2.8 cm$^{-1}$ (as compared to the FWHM of 3.5 cm$^{-1}$ for a piece of single crystal diamond), with the Raman shift centered between 1331.9 and 1332.1 cm$^{-1}$, suggesting no presence of stress in the diamond film on the growth side. The diamond crystals on the nucleation side are also very good, as evidenced by a Raman peak FWHM of 3.8 to 4.1 cm$^{-1}$, centered at 1331.6 cm$^{-1}$ (indicating low stress in the diamond film on nucleation side).

Example 2: Producing Thin Diamond Substrate or Window with One Surface or Two Surfaces Having Optical Finishing A piece of single crystal silicon substrate (or layer) 4 of 2 inches (50.8 mm) in diameter and 10 mm in thickness was fabricated in a typical silicon fabrication process. Both surfaces of this silicon substrate 4 were optically finished via typical chemical-mechanical polishing process to an Ra of less than 1 nm. This silicon substrate 4 was then ultrasonically-treated treated with a diamond-ethanol suspension slurry and loaded in microwave plasma CVD reactor 116 (FIG. 3), with surface 12 facing in the direction where plasma 120 will be formed.

A mixture of 1,850 mL/min hydrogen and 13.6 mL/min methane was flowed into the microwave plasma CVD reactor 116. After plasma 120 ignition, the microwave power and the reactor pressure were tuned so that the plasma 120 size covered surface 12 of silicon substrate 4. The diamond growth temperature at the center of surface 12 of silicon substrate 4 was controlled, e.g., via optical pyrometer 126, to 800° C. After 140 hours of diamond growth, the reaction was stopped resulting in a polycrystalline diamond film 6 of 200 to 220 microns in thickness conformingly deposited on surface 12 of silicon substrate 4. The diamond growth surface 14, while the diamond layer 6 was still on the silicon layer 4, was then lapped and polished to a surface roughness of Ra 5.0 nm. After lapping and polishing, the thickness of diamond layer 6 on silicon layer 4 was 125 microns. The silicon layer 4 was then stripped off with a KOH solution at elevated temperatures, followed by HF—HNO$_3$ stripping, resulting in a piece of free-standing diamond film 6 with a diameter of 2 inches (50.8 mm), a thickness of 125 microns, and an aspect ratio of 406. Both surfaces of this free-standing diamond film 6 had an optically finish, applicable for uses as an optical window or a substrate for other applications.

A second piece of single crystal silicon substrate (or layer) 4 of 2 inches (50.8 mm) in diameter and 10 mm in thickness was fabricated in a typical silicon fabrication process. Both surfaces 12 and 16 of this silicon substrate 4 were optically-finished with a typical chemical-mechanical polishing process to an Ra of less than 1 nm. Then, this silicon substrate 4 was ultrasonically-treated with a diamond-methanol suspension slurry. This silicon substrate 4 was then loaded into microwave plasma CVD reactor 116, with surface 12 facing in the direction where plasma 120 will be formed.

A mixture of 2,700 mL/min hydrogen and 16.2 mL/min methane was flowed into the microwave plasma CVD reactor 116. After plasma 120 initiation, the microwave power and the reactor pressure were tuned so that the plasma 120 size covered surface 12 of silicon substrate 4. The diamond growth temperature at the center of surface 12 was controlled, e.g., via optical pyrometer 126, to between 832° C. and 866° C. After 72 hours of diamond growth, the reaction was stopped resulting in a polycrystalline diamond film 6 of 110 to 130 microns in thickness conformingly deposited on surface 12 of silicon substrate 4. The diamond growth surface 14, while diamond film 6 was still on the silicon substrate 4, was then lapped and polished to a surface roughness (Ra) of 5.8 nm. After lapping and polishing, the thickness of diamond film 6 on silicon substrate 4 was 60 to 70 microns. The silicon substrate 4 was then stripped off with a KOH solution at elevated temperatures, followed by HF—HNO$_3$ stripping, resulting in a piece of free-standing diamond film 6 with a diameter of 2 inches, a thickness of 60-70 microns, and an aspect ratio of 781. Both surfaces of this free-standing diamond 6 had an optically finish, applicable for uses as an optical window or a substrate other applications.

A third piece of single crystal silicon substrate (or layer) 4 of 2 inches (50.8 mm) in diameter and 10 mm in thickness was fabricated in a typical silicon fabrication process. Both surfaces 12 and 16 of this silicon substrate 4 were optically finished with a typical chemical-mechanical polishing process to an Ra of less than 1 nm. Then, silicon substrate 4 was rubbed with a 0.25 micron diamond slurry to an optical finish, followed by a typical cleaning process. This silicon substrate 4 was then loaded into microwave plasma CVD reactor 116, with the diamond-slurry-rubbed optically-finished surface 12 facing in the direction where plasma 120 will be formed.

A mixture of 2,700 mL/min hydrogen and 16.2 mL/min methane was flowed into the microwave plasma CVD reactor 116. After plasma 120 ignition, the microwave power and the reactor pressure were tuned so that the plasma 120 size covered the surface 12 of silicon substrate 4. The diamond growth temperature at the center of surface 12 was controlled, e.g., via optical pyrometer 120, to between 794 and 835° C. After 95 hours of diamond growth, the reaction was stopped resulting in a polycrystalline diamond film 6 of 156 microns in thickness conformingly deposited on surface 12 of the silicon substrate 4. The diamond film 6 harvested (by removing silicon layer 4) had an aspect ratio of 326. The surface roughness of the nucleation side 10 was 7.7 nm and the surface of the growth side 14 of the diamond film 6 was rough, as is typical for an as-grown diamond surface.

Example 3: Diamond Growth on a Piece of 166 mm×10 mm Single Crystal Si Substrate with Both Surfaces Chemically-etched, Producing Thin Diamond Substrate(s) with One Surface Having Optical Finishing A piece of single crystal silicon substrate 4 of 166 mm in diameter and 10 mm in thickness was fabricated in a typical silicon fabrication process. Both surfaces 12 and 16 of this silicon substrate 4 were finished with a typical chemical-etching process. Then, this silicon substrate 4 was rubbed with diamond powders and loaded into microwave plasma CVD reactor 116.

A mixture of 2,800 mL/min hydrogen and 84 mL/min methane was flowed into the microwave plasma CVD reactor 116. After plasma 120 ignition, the microwave power and the reactor pressure were tuned so that the plasma size covered surface 12 of the silicon substrate 4. The diamond growth temperature at the center of surface 12 was controlled, e.g., via optical pyrometer 126, to 1120° C. After 44 hours of diamond growth, the reaction was stopped resulting in a composite substrate 2 comprising polycrystalline diamond film 6 of 350 microns in thickness conformingly deposited on the surface 12 of silicon substrate 4. The diamond growth surface 14, while the diamond was still on the silicon substrate 4, was then lapped flat. After lapping, the diamond film 6 thickness was 300 microns. Then, the exposed silicon surface 16 of this piece of diamond-on-silicon substrate 2 was lapped until the total thickness of this composite substrate 2 was 1.7-1.8 mm.

The lapped diamond surface 14 was then further polished to an optical finish, producing a thin diamond film (i.e., thinner than 300 micron in thickness) on a silicon substrate 4 of 166 mm in diameter. This composite substrate 2 can be used as an optical mirror, or as a substrate for electronics, photonics, or optoelectronics. The silicon substrate 4 was then stripped off, producing a free standing thin diamond film 6 with a growth surface optically finished, having an aspect ratio of ≥533.

Prior to removal of silicon substrate 4, a piece 50 mm in diameter and several pieces 1 inch in diameter were laser-cut from the diamond-on-silicon composite substrate 2 for polishing the diamond growth surface 14. The growth surface 14 roughness of the 50 mm piece reached 1 nm; and the finished diamond layer 6 thickness was estimated to be 170-180 microns. The silicon substrate 4 was then be stripped off with a KOH solution at elevated temperatures, followed by HF—HNO$_3$ stripping, resulting in a free-standing diamond layer 6 with a diameter of 50 mm in diameter, a thickness of 175 microns, and an aspect ratio of 285. Its diamond growth surface 14 was optically-finished, applicable for uses as an optical mirror or a substrate for other applications such as thermal management. Alternatively, to removing the silicon substrate 4, the silicon substrate 4 can be thinned and surface 16 polished so that a piece of diamond-silicon composite substrate 2 with at least the diamond surface 14 that is finished optically is obtained.

Example 4: Diamond Growth on a Piece of 166 mm×10 mm Polycrystalline Si Substrate with Both Surfaces Chemically-etched, Producing Thin Diamond Substrate(s) with One Surface Having Optical Finishing A piece of polycrystalline silicon substrate 4 of 166 mm in diameter and 10 mm in thickness was fabricated via a typical silicon fabrication process. Both surfaces 12 and 16 of this piece of silicon substrate 4 were finished with a typical chemical-etching process. Then, this piece of silicon substrate 4 was rubbed with diamond powders and then loaded into microwave plasma CVD reactor 116.

A mixture of 2,800 mL/min hydrogen and 84 mL/min methane was flowed into the microwave plasma CVD reactor 116. After plasma 120 ignition, the microwave power and the reactor pressure were tuned so that the plasma size covered surface 12 of the silicon substrate 4. The diamond growth temperature at the center of surface 12 was controlled, e.g., via optical pyrometer 126, to 1120° C. After 24 hours of diamond growth, the reaction was stopped resulting in a polycrystalline diamond film 6 of 175 microns in thickness conformingly deposited on the surface 12 of the silicon substrate 4. The diamond growth surface 14, while the diamond was still on the silicon substrate 4, was then lapped flat. The lapped diamond growth surface 14 was further polished to an optical finish. The silicon substrate 4 was then stripped off with a KOH solution at elevated temperatures, followed by HF—HNO$_3$ stripping, resulting in a free-standing diamond film 6 with a diameter of 166 mm, a thickness of less than 175 microns, and an aspect ratio of 948. The diamond growth surface 14 that was optically-finished, can be used as an optical mirror or can be used as a substrate for other applications such as thermal management. Alternatively to removing silicon substrate 4, the silicon substrate 4 (while the diamond layer 6 is still attached) can optionally be thinned and surface 16 polished so that a piece of diamond-silicon composite substrate 2 with at least the diamond surface finished optically is obtained, which can be useful as an optical mirror, or a substrate for electronics, photonics, or optoelectronics.

Example 5: Diamond Growth on a Piece of 166 mm×10 mm Polycrystalline Si Substrate with One Surface Optically-Finished (Ra 1.3 nm) by a Chemical Mechanical Polishing Process, Producing a Thin Diamond Window or Substrate with One Surface or Both Surfaces Optically Finished A piece of polycrystalline silicon substrate 4 of 166 mm in diameter and 10 mm in thickness was fabricated in a typical silicon fabrication process. Both surfaces 12 and 16 of this piece of silicon substrate 4 were finished via a typical chemical-etching process. Then, surface 12 was polished to an optical finish (Ra 1.3 nm) with a chemical mechanical polishing process. This piece of silicon substrate 4 was then treated ultrasonically with an aqueous diamond slurry and then loaded into microwave plasma CVD reactor 16 with surface 12 facing in the direction where plasma 120 will be formed.

A mixture of 2,800 mL/min hydrogen and 16.8 mL/min methane was flowed into the microwave plasma CVD reactor 116. After plasma 120 ignition, the microwave power and the reactor pressure were tuned so that the plasma size covered surface 12 of silicon substrate 4. The diamond growth temperature at the center of surface 12 was controlled, e.g., via optical pyrometer 126, to between 846 and 868° C. After 164 hours of diamond growth, the reaction was stopped resulting in a polycrystalline diamond film 6 of 295 microns in thickness conformingly deposited on the surface 12 of the silicon substrate 4. The diamond growth surface 14, while the diamond layer 6 was still on the silicon layer 4, was then lapped flat. The lapped diamond surface 14 was further polished to an optical finish, which resulted in diamond layer 6 having an aspect ratio of 563.

The silicon layer 4 side of this diamond-silicon composite substrate 2 was ground to a total thickness of 1.7-2.0 mm. The diamond-silicon composite substrate 2 was then laser-cut to pieces of 1" (25.4 mm) in diameter and 85 mm in diameter, followed by optical polishing of the growth surface 14 of diamond layer 6 to attain an optically-finished surface with a diamond layer 6 thickness ≤150 microns.

In an example, the silicon layer 4 can then be stripped off with a KOH solution at elevated temperatures, followed by HF—HNO$_3$ stripping, resulting in free-standing diamond layers 6 of 1" (25.4 mm) and 85 mm in diameter, a thickness ≤150 microns, and an aspect ratio of 566. The diamond growth surface 14 that is optically-finished can be used as an optical mirror or can be used as a substrate for other applications such as thermal management. Alternatively to removing silicon substrate 4, the silicon substrate 4 (while the diamond layer 6 is still attached) can be thinned and surface 16 polished so that a piece of diamond-silicon composite substrate 2 with at least an optically finished diamond surface is obtained, which can be useful as an optical mirror, or as a substrate for electronics, photonics, optoelectronics, etc.

Comparative Example 1: Failures in Diamond Growth on Silicon Wafers (6" in Diameter and 625 Microns in Thickness)

Three silicon substrates or wafers 4 (n-type, 6 inches (152.4 mm) in diameter and 625 microns in thickness) were provided. Surface 12 of each silicon wafer 4 was chemically-mechanically polished to an optical surface finish and the other surface 16 of each silicon wafer 4 was finished with chemical etching. Surface 12 (optically finished) of each silicon wafer 4 was then rubbed with diamond powders and the silicon wafer 4 was placed inside microwave plasma CVD reactor 116 for diamond growth, with the optically-finished surface 12 facing in the direction where plasma 120 will be formed.

A mixture of 2,500 mL/min hydrogen and 75 mL/min methane was flowed into the microwave plasma CVD reactor 116. After plasma 120 ignition, the microwave power and the reactor pressure were tuned so that the plasma size covered surface 12 of the silicon wafer 4. During this plasma tuning process, the silicon wafer 4 shattered into a number of smaller pieces. This experiment was repeated with the other two silicon wafers 4, varying the rate of the power and pressure increases, with the same result, namely, the other two silicon wafers also shattered into a number of smaller pieces.

Comparative Example 2: Failures in Attaining Optically-Finished Diamond that is Thinner than 400 Microns in Thickness Pieces of diamond with diameters of 50 mm, 75 mm, 85 mm, and 100 mm were laser-cut from an as-grown diamond wafer with a thickness greater than 550 microns. In an example, this as-grown diamond wafer was grown directly on substrate holder 122 of microwave plasma CVD reactor 116 without having a silicon layer 4 between the as-grown diamond wafer and substrate holder 122. Then, the growth surface of each diamond piece was lapped flat. Then, one side of each surface, either the growth surface or the nucleation surface, of these diamond pieces were polished to an optical-finish by a conventional polishing technique. When flipping over and trying to thin and polish the other surface, these diamond pieces shattered before approaching 400 microns in thickness, suggesting that an aspect of ratio of 125 is difficult to achieve with conventional diamond polishing processes.

Example 6: Producing Thin Diamond Coating on Silicon Substrate with Both Surfaces Having Optical Finishing A polycrystalline silicon substrate 4 of 75 mm in diameter and 10 mm in thickness was used as substrate for diamond CVD growth of a diamond layer 6. Surface 12 of this silicon substrate 4 was polished to a mirror finish with roughness Ra<1 nm. In order to achieve high diamond nucleation density on the mirror finished silicon surface 12, while also obtaining good diamond-to-silicon adhesion to prevent the diamond layer from delaminating from this silicon substrate 4, a two-step seeding process was employed. Firstly, this silicon substrate 4 was treated with 0.25 µm average size diamond powder/methanol suspension solution in an ultrasonic bath. Then, a first step diamond nucleation process on surface 12 was carried out on silicon substrate 4 for one hour in microwave plasma CVD reactor 116 whereupon silicon substrate 4 was removed from microwave plasma CVD reactor 116. This nucleation step resulted in relatively low density diamond nucleation at <$10^5$/cm$^2$.

Figure 6:
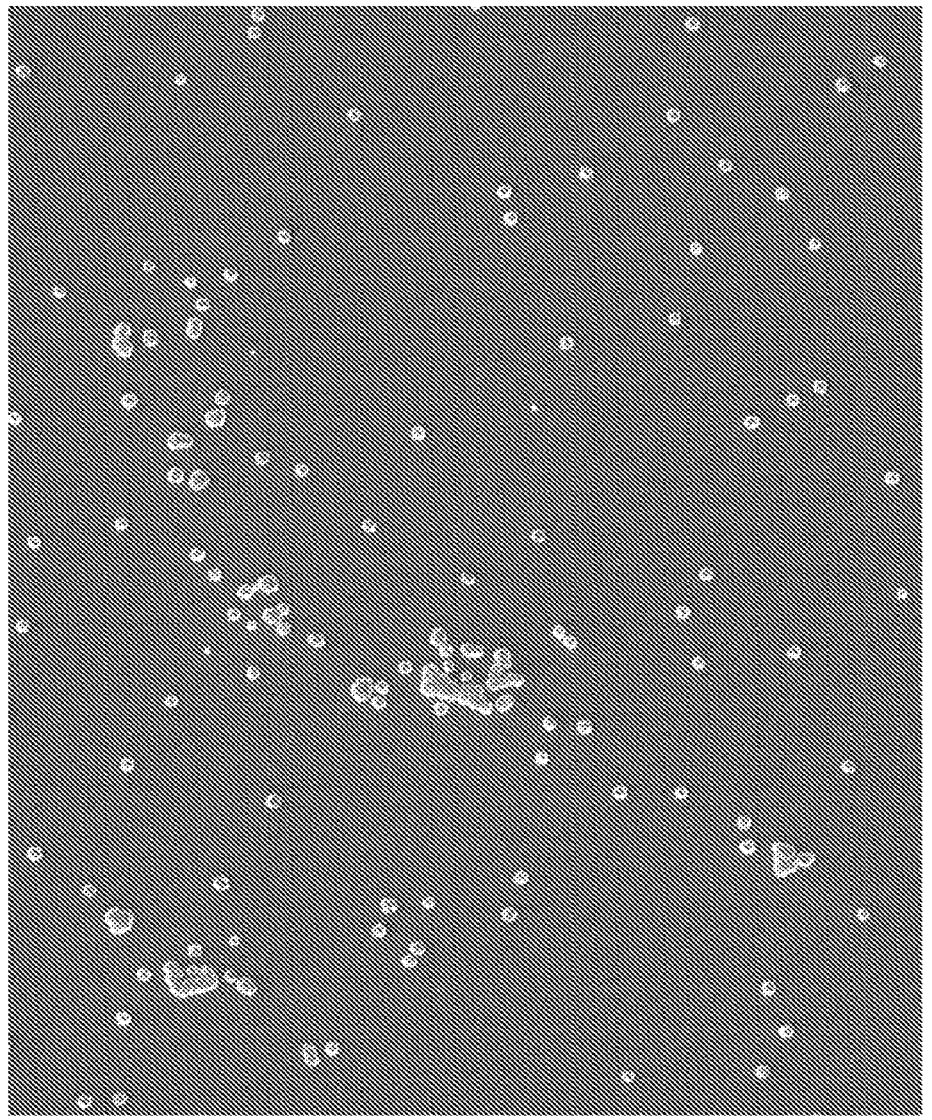
FIG. 6 is an SEM photo of a silicon surface of a polysilicon substrate on which a diamond film is grown after a first seeding step that includes nucleation of diamond on the silicon surface in accordance with Example 6 herein.

FIG. 6 is an SEM photo of the silicon surface after the first nucleation step.

Next, this silicon substrate 4 (after the first nucleation step) was treated with nano-crystal diamond powder/methanol suspension solution in ultrasonic bath. Then, this silicon substrate 4 was re-loaded into the microwave plasma CVD reactor 116 for a second step nucleation and consecutive diamond growth on silicon surface 12.

Figure 7:
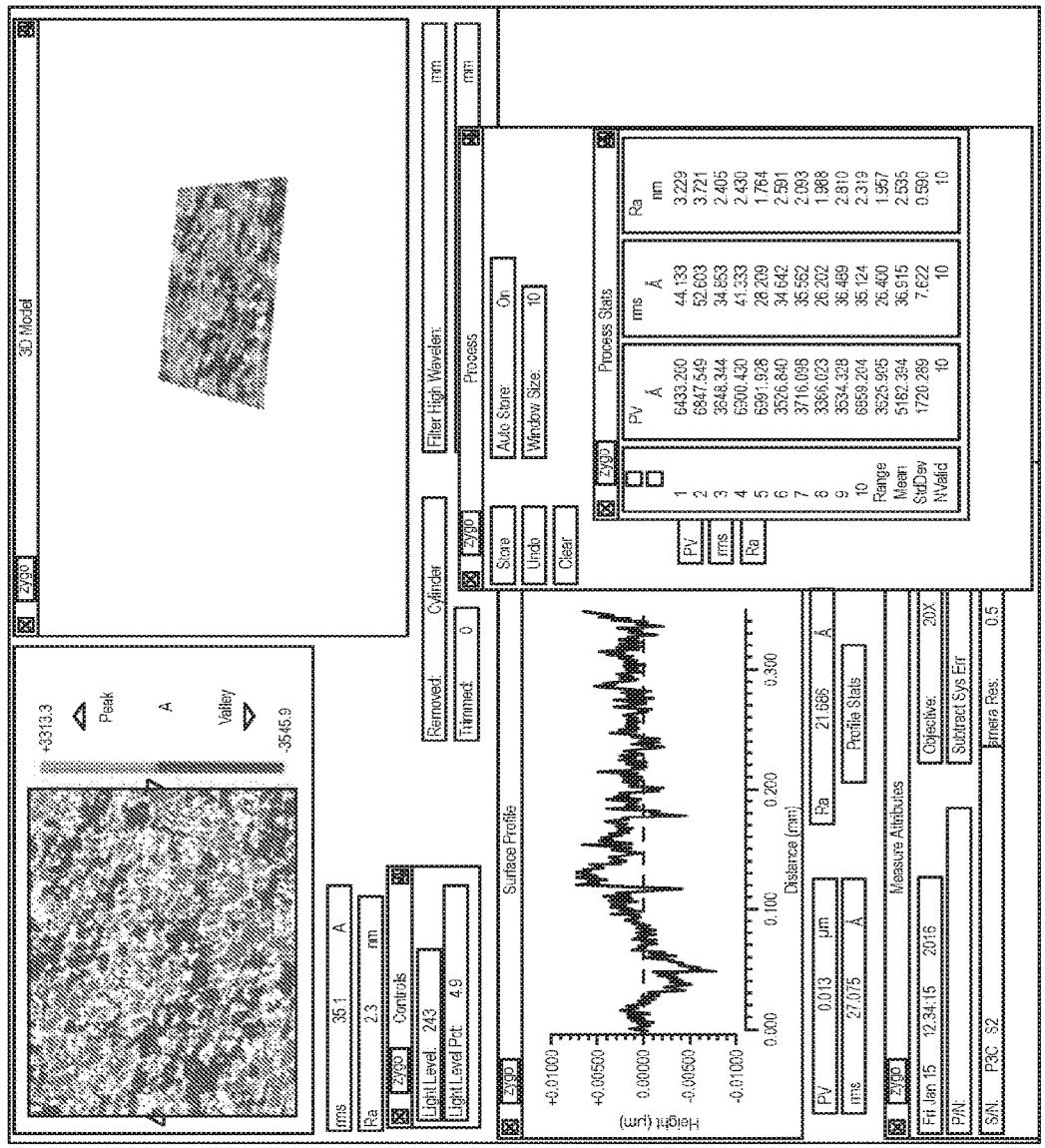
FIG. 7 is an interferometer roughness measurement of the polished diamond growth surface of the diamond on silicon substrate of Example 6 herein.

To this end, a mixture of 2,400 mL/min hydrogen and 16.8 mL/min methane was flowed into the microwave plasma CVD reactor 116 in the first step and second step diamond nucleation process. After initiating the plasma 130, the microwave power and the reactor pressure were tuned so that the plasma size covered the surface 12 of the silicon substrate 4. The diamond growth temperature at the center of surface 12 was controlled, via control pyrometer 126, at 800° C. by cooling substrate holder 4. After 14 hours of diamond growth in the second step nucleation, the reaction was stopped, resulting in a polycrystalline diamond film 6 of 20 µm thickness conformingly deposited on surface 12 of the silicon substrate 4. The diamond growth surface 14, while still on the silicon substrate 4, was then polished until diamond film 6 had a thickness of 10 µm and a surface 14 roughness of avg. Ra=2.5 nm (as shown in FIG. 7).

Figure 8:
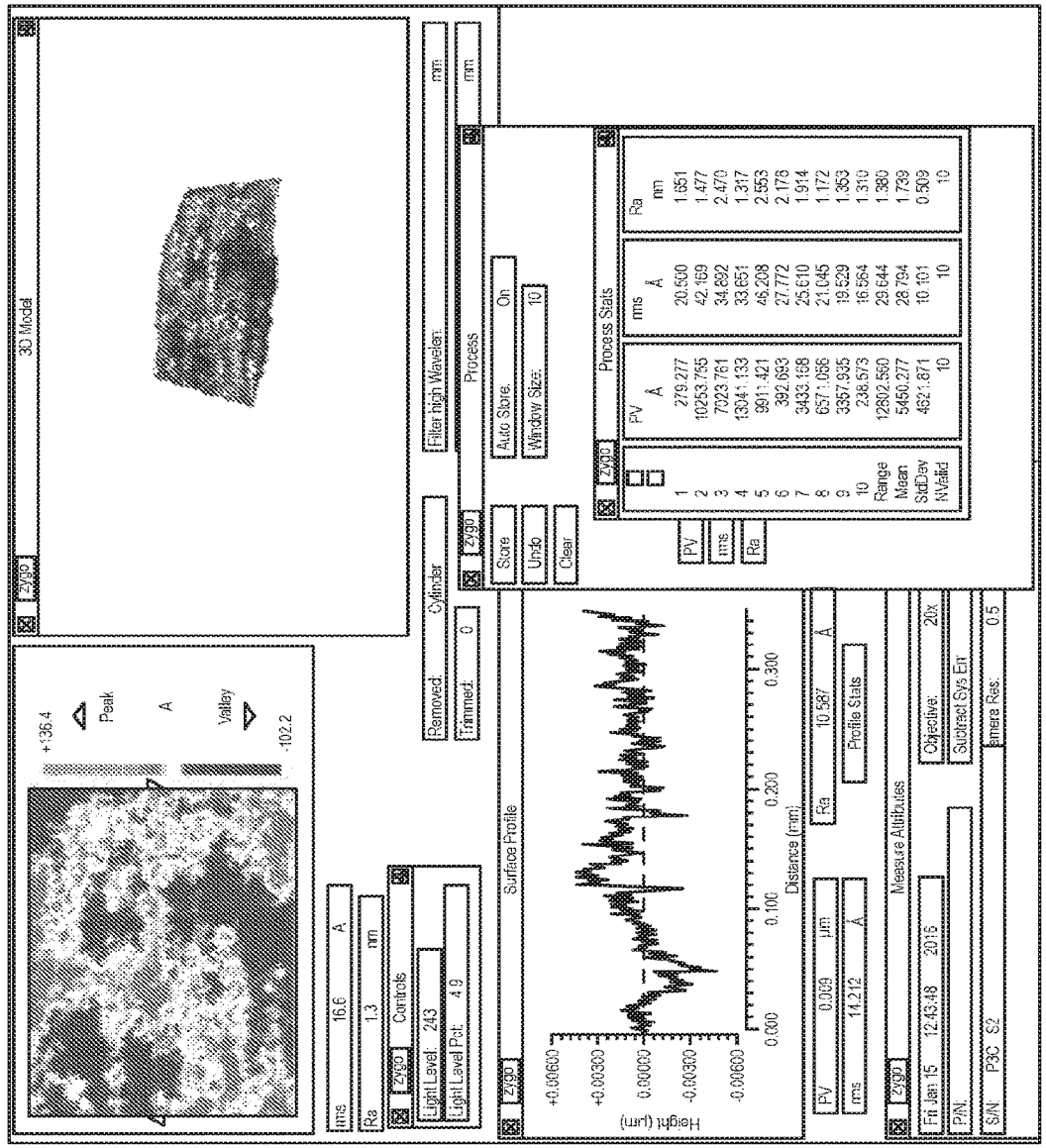
FIG. 8 is an interferometer roughness measurement of the diamond nucleation side surface of the diamond on silicon substrate of Example 6 herein.
Figure 9:
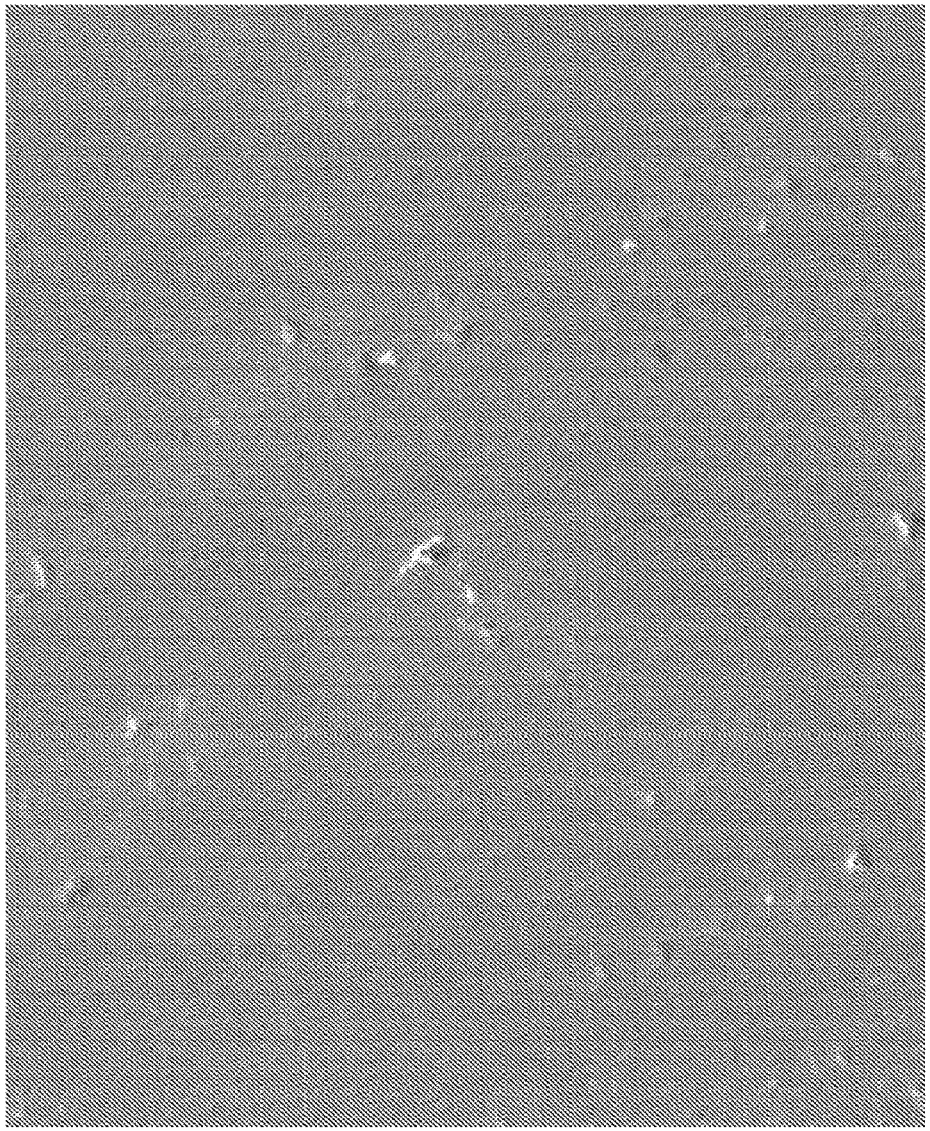
FIG. 9 is an SEM photo of the diamond nucleation side surface of the diamond on silicon substrate of Example 6 herein.
Figure 10:
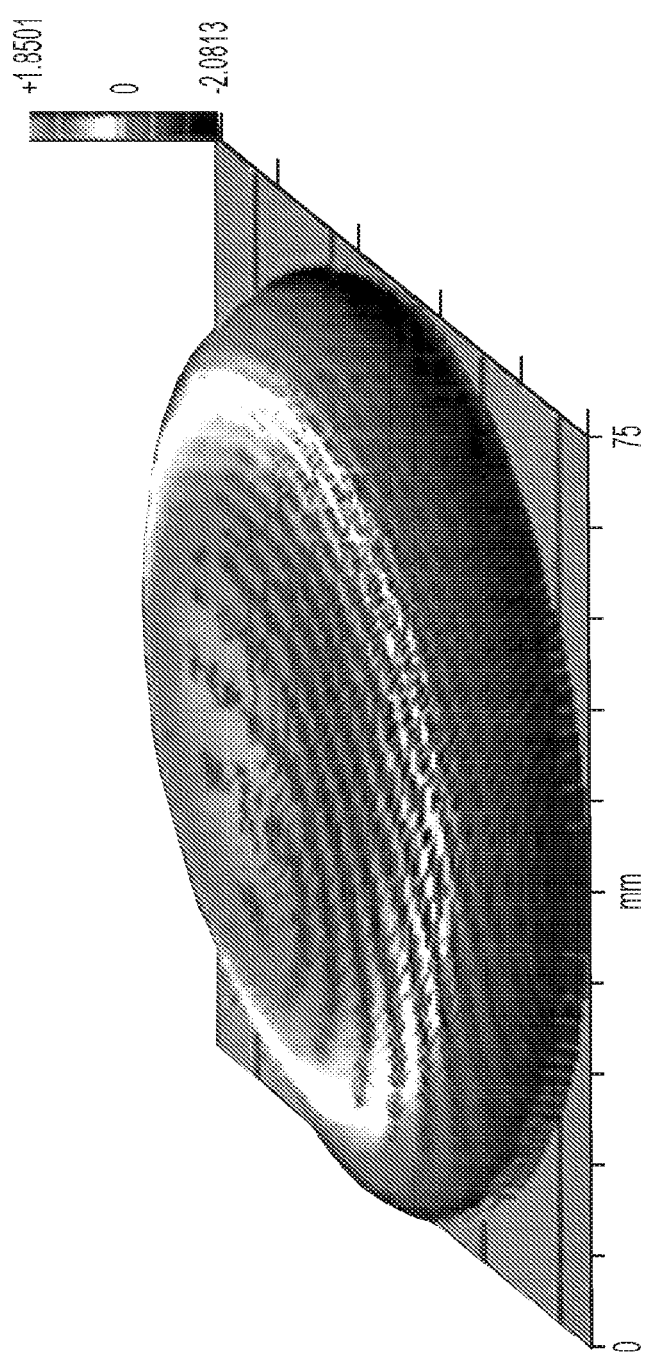
FIG. 10 is an interferometer surface contour measurement of the diamond growth surface of the diamond on silicon substrate of Example 6 herein.

The surface roughness of the diamond nucleation side 10 at the silicon-diamond interface 8 was measured on another diamond sample formed using the same 2-step seeding process and after silicon stripping. The average surface roughness was measured to be avg. Ra=1.7 nm (as shown in FIG. 8). The diamond nucleation density was estimated under SEM to be >$10^9$/cm$^2$ after the second nucleation step (as seen in FIG. 9). The flatness of the polished diamond growth surface 14 was studied under optical interferometer. The diamond growth surface 14 was determined to be slightly convex, with a peak-to-valley height difference across entire 75 mm diameter surface of 1.53 µm, and an irregularity of 0.53 µm (as shown in FIG. 10).

Diamond quality and phase purity were evaluated using a Raman spectroscope. FIG. 11 shows Raman spectra collected from (a) the as-grown diamond growth surface 14 and (b) polished diamond growth surface 14 with 514 nm excitation laser. Sharp diamond peaks at 1332 cm$^{-1}$ with peak width (FWHM) of 4.3-6.2 cm$^{-1}$ were observed with no detectable sp$^2$ carbon signals, meaning a high quality diamond layer 6 was deposited on silicon layer 4. A strong peak also presents at 520 cm$^{-1}$, which is a silicon Raman peak. This silicon peak comes from the silicon substrate or layer 4 underneath diamond layer 6.

Example 7: Producing Thin Diamond Coating on Silicon Substrate with One Surface Having Optical Finishing A polycrystalline silicon substrate 4 of 75 mm in diameter and 10 mm in thickness was used as substrate for diamond CVD growth of a diamond layer 6. Both surfaces 12 and 16 of this silicon substrate 4 were chemically etched. This silicon substrate 4 was then treated with nano-crystalline diamond powder/methanol suspension solution in an ultrasonic bath to promote diamond nucleation. The silicon substrate was then loaded into microwave plasma CVD reactor 116.

A mixture of 2,400 mL/min hydrogen and 16.8 mL/min methane was flowed into the microwave plasma CVD reactor 116. After initiating the plasma 120, the microwave power and the reactor pressure were tuned so that the plasma 120 size covered the surface 12 of the silicon substrate 4 facing the plasma 120. The diamond growth temperature at the center of the surface 12 of the silicon substrate 4 facing the plasma 120 was controlled, via optical pyrometer 126, at 800° C. by cooling substrate holder 122. After 10 hours of diamond growth, the reaction was stopped resulting in a polycrystalline diamond film 6 of 14 microns thickness conformingly deposited on the surface 12 of the silicon substrate 4. The diamond growth surface 14, while still on the silicon substrate 4, was polished until diamond layer 6 had a thickness of 8 microns and a surface roughness of avg. Ra=3.0 nm.

Example 8. Diamond Growth on an Optically Finished Polycrystalline Silicon Substrate (166 mm Diameter×10 mm Thickness) by 0.25 mm Diamond Particle Seeding In another example, a polycrystalline silicon substrate 4 of 166 mm in diameter and 10 mm in thickness was used as a substrate for CVD growth of diamond layer 6. Both surfaces 12 and 16 of this silicon substrate 4 were finished via a typical chemical-etching process. Surface 12 of this silicon substrate 4 was then chemically-mechanically polished to a mirror finish with roughness Ra≤1.5 nm. The entire silicon substrate 4 was then treated (seeded) ultrasonically in a ultrasonic bath in a 0.25 µm average size diamond powder/methanol suspension solution and then placed in a CVD reactor 116 (FIG. 2) with surface 12 facing quartz window 118 (FIG. 3).

A mixture of 2,800 mL/min hydrogen and 16.8 mL/min methane was then flowed into CVD reactor 116 under the control of mass flow controller 108. After plasma 120 ignition, the microwave 114 power and the reactor 116 pressure were tuned so that the plasma 120 size covered surface 12 of silicon substrate 4. The diamond growth temperature at the center of substrate was controlled, e.g., via optical pyrometer 126, to between 845 and 868° C. After 163 hours of diamond growth, the diamond growth reaction was stopped resulting in a silicon-diamond composite with a polycrystalline diamond film 6 thickness of 295 µm conformingly deposited on surface 12 of silicon substrate 4—an aspect ratio of 563.

While diamond film 6 was adhered to silicon substrate 4, the growth surface of diamond film 6 was polished to an optically finish (Ra between 3-5 nm) and a thickness (of diamond film 6) of 99 microns—an aspect ratio of 168. While diamond film 6 was still adhered to silicon substrate 4, the silicon-diamond composite was laser-cut to a number of different pieces having different diameters, followed by removal of the silicon substrate 4 (dissolved by KOH solution) of each piece thereby forming pieces of free-standing diamond film 6. The nucleation surfaces of these pieces of free-standing diamond film 6 had an average surface roughness (Ra) between 5 and 9 nm, and a nucleation density of ≥$10^5$/cm$^2$. One of these pieces of free-standing diamond film 4 had a thickness of 99 microns and was characterized for 1.06 µm wavelength light scattering with a light scattering coefficient of 8.22/cm at a distance of 34.0 mm from a scattering light collection lens.

Example 9. Growth Diamond on Optically Finished Silicon Substrate (2 Inch (50.8 mm) Diameter×10 mm in Thickness) by 1$^{st}$ Step Seeding (0.25 mm Diamond Particle Seeding) and Followed by 2" Step Seeding (Nano-Diamond Particle Seeding)

In another example, a polycrystalline silicon substrate 4 of 50.8 mm in diameter and 10 mm in thickness was used as a substrate for CVD growth of diamond layer 6. Both surfaces 12 and 16 of this silicon substrate 4 where were chemically-mechanically polished to a mirror finish with roughness Ra≤1.5 nm. The entire silicon substrate 4 was then ultrasonically treated (seeded) in a 0.25 µm average size diamond powder/methanol suspension solution and then placed in a CVD reactor 116 (FIG. 3). This silicon substrate 4 was then loaded into microwave plasma CVD reactor 116.

A mixture of 2,800 mL/min hydrogen and 16.8 mL/min methane was then flowed into CVD reactor 116 under the control of mass flow controller 8. After plasma 120 ignition, the microwave 114 power and the reactor 116 pressure were tuned so that the plasma 120 size covered surface 12 of silicon substrate 4 that faced quartz window 118. The diamond growth temperature at the center of silicon substrate 4 was controlled, e.g., via optical pyrometer 126, to 780° C. After one hour of diamond growth, the diamond growth reaction was stopped, and the diamond-seeded silicon substrate 4 was observed to have diamond particles deposited about surface 12 of silicon substrate 4.

The diamond-seeded silicon substrate 4 was then removed from CVD reactor 116 and ultrasonically treated in a nano-crystal diamond powder (typical particle size ≤20 nm)/methanol suspension solution in a ultrasonic bath. The nano-diamond-treated diamond-seeded Si substrate was then reloaded into CVD reactor 116 with surface 12 again facing plasma 120. A mixture of 2,800 mL/min hydrogen and 16.8 mL/min methane was then flowed into CVD reactor 116 under the control of mass flow controller 8. After plasma 120 ignition, the microwave 114 power and the reactor 116 pressure were tuned so that the plasma 120 size covered surface 12 of silicon substrate 4. The diamond growth temperature at the center of the silicon substrate 4 was controlled, e.g., via optical pyrometer 126, to between 790 and 821° C.

After an additional 143 hours of diamond growth, the diamond growth reaction was stopped resulting in a silicon-diamond composite with a diamond film 6 thickness of 245 microns—an aspect ratio of 207. The diamond growth surface, while diamond film 6 was still on silicon substrate 4, was polished to an optical finish (Ra between 3-5 nm) and a thickness (of diamond film 6) of 197 microns—an aspect ratio of 258.

Silicon substrate 4 was then removed (dissolved with a KOH solution) from this silicon-diamond composite leaving a free-standing diamond film 6. The nucleation surface of this free-standing diamond film 6 had an average surface roughness (Ra)=2.73 nm, a nucleation density of ≥$10^9$/cm$^2$, and a smooth surface finish, the latter two of which are highly desirable for applications such as, for example, thermal management, optical management, semiconductor device, friction control, acoustic wave management, etc. This free-standing diamond film 6 was also characterized for 1.06 µm wavelength light scattering with a light scattering coefficient of 2.69/cm at a distance of 34 mm from the scattering light collection lens. 1.06 µm wavelength light scattering is considered in the art as low micron light scattering and is highly desirable for optical, thermal, acoustic applications, etc.

Example 10. Growth Diamond on Optically Finished Silicon Substrate (2 Inch (50.8 mm) Diameter×10 mm in Thickness) by One Step Seeding (Nano-Diamond Particle Seeding)

In another example, a polycrystalline silicon substrate 4 of 50.8 mm in diameter and 10 mm in thickness was used as a substrate for CVD growth of diamond layer 6. Surface 12 of this silicon substrate 4 was chemically-mechanically polished to a mirror finish with roughness Ra<1.5 nm, while the other surface 16 was etched via a typical chemical-etching process. Next, this silicon substrate 4 was ultrasonically treated in a nano-crystal diamond powder (typical particle size <20 nm)/methanol suspension solution in a ultrasonic bath. This silicon substrate was then loaded into CVD reactor 116 with Surface 12 facing quartz window 118.

A mixture of 2,800 mL/min hydrogen and 16.8 mL/min methane was then flowed into CVD reactor 116 under the control of mass flow controller 108. After plasma 120 ignition, the microwave 114 power and the reactor 116 pressure were tuned so that the plasma 120 size covered surface 12 of silicon substrate 4. The diamond growth temperature at the center of silicon substrate 4 was controlled, e.g., via optical pyrometer 126, to 800° C.

After 118 hours of diamond growth, the diamond growth reaction was stopped resulting in a silicon-diamond composite with a diamond film 6 thickness of 190 µm conformingly deposited on surface 12 of silicon substrate 4. The diamond growth surface, while diamond film 6 was still on silicon substrate 4, was polished to an optical finish and a thickness (of diamond film 6) of 140 microns.

Silicon substrate 4 was then removed (dissolved with a KOH solution) from this silicon-diamond composite leaving a free-standing diamond film 6. The nucleation surface of this free-standing diamond film 6 had an average surface roughness (Ra) between 2 and 3 nm, a nucleation density of $\geq 10^9/cm^2$, and a smooth surface finish, the latter two of which are highly desirable for applications such as, for example, thermal management, optical management, semiconductor device, friction control, etc.

This free-standing diamond film 6 was also characterized for 1.06 μm wavelength light scattering with a light scattering coefficient at 2.09/cm at a distance 34 mm from the scattering light collection lens.

Several additional runs in accordance with the principles of this Example 10 on different silicon substrates 4 under the same diamond growth conditions experienced problems. In one example, diamond film 6 delaminated from silicon substrate 4, which did not allow for further polishing to be performed on the growth surface of the delaminated diamond film. These examples suggest that nano-diamond seeding alone may not be a reliable process for producing a thin diamond substrate with at least one optically finished surface. This suggests that the diamond film 6 is not strongly adhered to silicon substrate 4 with nano-diamond seeding process.

In an example, a dielectric film 13 can be included on the surface 12 of any one or more of the substrates described herein as a possible aid to adhesion of diamond film 6 on the substrate via the dielectric film 13. However, this is not to be construed in a limiting sense.

As can be seen, disclosed herein is a multilayer composite substrate comprising a silicon layer having an optically finished surface and a chemical vapor deposition (CVD) grown diamond layer on the optically finished surface of the silicon layer, wherein at an interface of the silicon layer and the diamond layer, the optically finished surface of the silicon layer has a surface roughness (Ra) ≤100 nm.

The multilayer composite substrate can optionally include a dielectric layer or film between the silicon layer and the diamond layer. The dielectric film can be $SiO_2$ or SiN.

At the interface of the silicon layer and the diamond layer, the optically finished surface of the silicon layer can have an Ra ≤1 nm.

At the interface of the silicon layer and the diamond layer, a surface of the diamond layer can have an Ra no less than the Ra of the optically finished surface of the silicon layer.

At the interface of the silicon layer and the diamond layer, a grain density of the diamond can be $\geq 10^9$ diamond grains/$cm^2$ or $\geq 10^4$ diamond grains/$cm^2$.

The silicon layer can have a thickness ≥5000 μm or a thickness ≥10 μm.

The diamond layer can have a thickness ≤2000 μm or a thickness ≤5 μm.

The multilayer substrate can have a largest dimension ≥25.4 mm or a largest dimension ≥152.4 mm.

The multilayer substrate can have a total thickness of the silicon layer and the diamond layer ≥50 μm or a total thickness of the silicon layer and the diamond layer ≥5 mm.

The surface of the diamond layer opposite the silicon layer can have an Ra ≤100 nm or an Ra ≤5 nm.

A light management coating can be included on a surface of the diamond layer opposite the silicon layer.

Diamond crystals on a surface of the diamond layer opposite the silicon layer can have a Raman peak between 1331.9 and 1332.1 cm−1, a full width at half maximum (FWMH) of the Raman spectrum between 2.8 and 6.2 cm−1, or both.

Also disclosed is a method of forming the multilayer substrate of claim 1, comprising: (a) providing a silicon layer having the optically finished surface; (b) following step (a), seeding the optically finished surface of the silicon layer with diamond particles; (c) following step (b), CVD depositing a diamond layer on the diamond seeded optically finished surface of the silicon layer; and (d) continue CVD depositing the diamond layer on the diamond seeded optically finished surface of the silicon layer until a predetermined thickness of the diamond layer is deposited on the diamond seeded optically finished surface of the silicon layer.

Between steps (c) and (d), the method can include the steps of: (c1) stopping CVD depositing the diamond layer on the diamond seeded optically finished surface of the silicon layer; and (c2) seeding the optically finished surface of the silicon layer including the CVD deposited diamond layer of step (c) with diamond particles.

The silicon layer of step (a) can include a substrate bonded to a side of the silicon layer opposite the optically finished surface. The substrate can be thicker than the silicon layer.

The method can further include, (e) polishing a surface of the diamond layer opposite the silicon layer to an optical finish.

The method can further include applying a light management coating on the polished surface of the diamond layer opposite the silicon layer.

While the foregoing examples have been described with reference to a multilayer composite substrate comprising a silicon layer having a chemical vapor deposition (CVD) grown diamond layer deposited on a surface of the silicon layer, it is also envisioned that a multilayer composite substrate in accordance with the principals described herein can include a diamond layer CVD grown on a surface of any suitable and/or desirable lattice matched substrate.

In an example, at 300° K diamond has a lattice constant of 3.57 angstrom, and silicon has a lattice constant 5.43 angstrom. Lattice constants of other elements at 300° K are known in the art and will not be described herein for brevity.

In an example, diamond layer 6 can be grown on a substrate made of any suitable and/or desirable material or combination of materials. Said substrate can be crystalline or amorphous (non-crystallized) material(s). In an example, when said substrate is made from crystalline material(s), the absolute lattice mismatch between diamond layer 6 and said substrate, i.e., the difference between the lattice constant of the diamond layer and the lattice constant of the substrate, can be from 0 to 4.5 angstrom. Herein, "lattice matched substrate" means that that absolute lattice mismatch between the substrate (of any material(s)) and diamond layer 6, i.e., the difference between the lattice constant of the diamond layer and the lattice constant of the substrate, is between 0 and 4.5 angstrom, e.g., ≤4.5 angstrom, ≤3.5 angstrom, ≤2.5 angstrom, or ≤2.0 angstrom. It is believed that a diamond layer 6 can be successfully CVD grown in accordance with the principals described herein on a surface of one or more lattice matched substrates known in the art.

The foregoing examples have been described with reference to the accompanying figures. Modifications and alterations will occur to others upon reading and understanding the foregoing examples which are provided for the purpose of illustration and are not to be construed in a limiting sense. Accordingly, the foregoing examples are not to be construed as limiting the disclosure.

The invention claimed is:

1. A multilayer substrate comprising:
   a silicon substrate comprising an optically finished surface with a surface roughness (Ra) of less than 100 nm; and
   a diamond layer on the optically finished surface, the diamond layer having a 1.06 micron light scattering coefficient, at a distance of 34 cm from a blocking lens, of less than or equal to 7/cm.

2. The multilayer substrate of claim 1, wherein the diamond layer has a 1.06 micron light scattering coefficient, at a distance of 34 cm from a blocking lens, of less than or equal to 5/cm.

3. The multilayer substrate of claim 1, wherein the diamond layer has a diamond nucleation density of greater than or equal to $1.0 \times 10^5/cm^2$.

4. The multilayer substrate of claim 1, wherein the diamond layer has a diamond nucleation density of greater than or equal to $1.0 \times 10^9/cm^2$.

5. The multilayer substrate of claim 1, wherein the silicon substrate comprises a dielectric film.

6. The multilayer substrate of claim 1, further comprising one or more light management coatings located on an exposed surface of multilayer substrate.

7. The multilayer substrate of claim 6, wherein the exposed surface is a surface of the diamond layer located opposite the silicon substrate.

8. The multilayer substrate of claim 1, wherein a surface of the silicon substrate opposite the diamond layer is bonded to another substrate.

9. The multilayer substrate of claim 8, wherein the other substrate is made of one of silicon, graphite, metal, ceramic or glass.

10. The multilayer substrate of claim 1, wherein the silicon substrate comprises an n-type dopant or a p-type dopant.

11. The multilayer substrate of claim 1, wherein the diamond layer comprises an n-type dopant or a p-type dopant.

12. The multilayer substrate of claim 1 formed by a method comprising:
    (a) providing the silicon substrate;
    (b) seeding the optically finished surface of the silicon substrate with diamond particles to form a diamond seeded optically finished surface;
    (c) growing the diamond layer on the diamond seeded optically finished surface using a first chemical vapor deposition;
    (d) stopping the growing of the diamond layer;
    (e) seeding the diamond layer with nanodiamond particles; and
    (f) growing the diamond layer on the nanodiamond particles using a second chemical vapor deposition.

13. The multilayer substrate of claim 12, wherein the method further comprises (g) polishing a surface of the diamond layer opposite the silicon substrate to an optical finish.

14. The multilayer substrate of claim 12, wherein at least one of the first chemical vapor deposition or the second chemical vapor deposition is performed using a microwave plasma growth system.

15. The multilayer substrate of claim 12, wherein the diamond particles that seed the optically finished surface of the silicon substrate are suspended in a liquid medium in a diamond slurry.

16. A multilayer substrate comprising:
    a first substrate;
    a second substrate bonded to the first substrate, the second substrate is made at least of silicon, the second substrate comprising an optically finished surface opposite the first substrate, the optically finished surface having a surface roughness (Ra) of less than 100 nm; and
    a diamond layer on the optically finished surface of the second substrate.

17. The multilayer substrate of claim 16, wherein the first substrate is made of silicon, graphite, metal, ceramic or glass.

18. The multilayer substrate of claim 16, wherein:
    the second substrate is bonded to the first substrate by a bonding agent, and
    the bonding agent comprises at least one of a polymer, a silicate, or a metal.

19. A multilayer substrate comprising:
    a silicon substrate comprising an optically finished surface with a surface roughness (Ra) of less than 100 nm; and
    a diamond layer on the optically finished surface, wherein
    at least one of the silicon substrate and the diamond layer comprises an n-type dopant or a p-type dopant.

* * * * *